United States Patent
Matsushima

(10) Patent No.: US 8,889,474 B2
(45) Date of Patent: Nov. 18, 2014

(54) ORGANIC LIGHT-EMITTING ELEMENT AND PROCESS FOR PRODUCTION THEREOF, AND ORGANIC DISPLAY PANEL AND ORGANIC DISPLAY DEVICE

(71) Applicant: Panasonic Corporation, Osaka (JP)

(72) Inventor: Hideaki Matsushima, Osaka (JP)

(73) Assignee: Panasonic Corporation, Osaka (JP)

( * ) Notice: Subject to any disclaimer, the term of this patent is extended or adjusted under 35 U.S.C. 154(b) by 46 days.

(21) Appl. No.: 13/716,551

(22) Filed: Dec. 17, 2012

(65) Prior Publication Data

US 2013/0105781 A1      May 2, 2013

Related U.S. Application Data

(63) Continuation of application No. PCT/JP2010/005219, filed on Aug. 25, 2010.

(51) Int. Cl.
  *H01L 27/32*      (2006.01)
  *H01L 51/52*      (2006.01)
  *H01L 51/00*      (2006.01)
  *H01L 51/50*      (2006.01)

(52) U.S. Cl.
  CPC ......... *H01L 51/5203* (2013.01); *H01L 51/5209* (2013.01); *H01L 27/3246* (2013.01); *H01L 27/3258* (2013.01); *H01L 51/0005* (2013.01); *H01L 51/5012* (2013.01); *H01L 2251/558* (2013.01)
  USPC ................... 438/99; 257/40; 438/22

(58) Field of Classification Search
  CPC ............ H01L 51/5203; H01L 51/5209; H01L 27/3246; H01L 27/3258; H01L 2251/558
  USPC ......................................... 257/40; 438/22, 99
  See application file for complete search history.

(56) References Cited

U.S. PATENT DOCUMENTS

| 5,443,922 | A | 8/1995 | Nishizaki et al. |
| 7,405,515 | B2 | 7/2008 | Satake |

(Continued)

FOREIGN PATENT DOCUMENTS

| JP | 05-163488 | 6/1993 |
| JP | 2004-127551 | 4/2004 |

(Continued)

OTHER PUBLICATIONS

"Notice of Allowance and Fee(s) Due," mailed May 23, 2014, in related U.S. Appl. No. 13/465,565.

(Continued)

*Primary Examiner* — Allan R Wilson
(74) *Attorney, Agent, or Firm* — Greenblum & Bernstein, P.L.C.

(57) ABSTRACT

In an interlayer insulating layer, upper surface portions in edge regions near banks are located higher than an upper surface portion in a central region. In an anode formed to extend along upper surface portions, upper surface portions in edge regions near banks are located higher than an upper surface portion in a central region. In hole injection transporting layer formed to extend along upper surface portions, upper surface portions in edge regions near banks are located higher than an upper surface portion in central region. In an organic light-emitting layer, upper surface portions in edge regions (regions $C_1$ and $C_2$) near banks are located higher than an upper surface portion in a central region (region $C_3$). As a result, in an organic light-emitting layer, thicknesses $D_1$ and $D_2$ are equal to thickness $D_3$.

15 Claims, 15 Drawing Sheets

(56) References Cited

U.S. PATENT DOCUMENTS

| | | |
|---|---|---|
| 7,456,431 B2 | 11/2008 | Um et al. |
| 7,605,535 B2 * | 10/2009 | Kobayashi ............... 313/506 |
| 7,803,669 B2 | 9/2010 | Cho et al. |
| 7,842,947 B2 | 11/2010 | Nakatani et al. |
| 7,903,055 B2 * | 3/2011 | Nishikawa et al. ............ 345/77 |
| 7,935,969 B2 | 5/2011 | Yamashita et al. |
| 7,955,908 B2 | 6/2011 | Ryu et al. |
| 8,203,158 B2 | 6/2012 | Yoshida et al. |
| 8,368,617 B2 * | 2/2013 | Asaki et al. ............... 345/76 |
| 8,436,348 B2 | 5/2013 | Ono et al. |
| 8,462,084 B2 * | 6/2013 | Asaki et al. ............... 345/76 |
| 8,481,351 B2 | 7/2013 | Kawasaki |
| 2004/0189194 A1 * | 9/2004 | Kihara et al. ............. 313/506 |
| 2004/0222740 A1 * | 11/2004 | Kim ............... 313/506 |
| 2006/0038488 A1 | 2/2006 | Fukunaga et al. |
| 2006/0086978 A1 | 4/2006 | Kobayashi |
| 2008/0023695 A1 | 1/2008 | Cho et al. |
| 2008/0024402 A1 * | 1/2008 | Nishikawa et al. ............ 345/82 |
| 2008/0143649 A1 | 6/2008 | Asaki et al. |
| 2008/0238295 A1 | 10/2008 | Takei et al. |
| 2010/0171115 A1 * | 7/2010 | Nakagawa ............... 257/40 |
| 2010/0181554 A1 | 7/2010 | Yoshida et al. |
| 2010/0265223 A1 | 10/2010 | Asaki et al. |
| 2012/0080694 A1 | 4/2012 | Yoshida et al. |
| 2013/0062635 A1 | 3/2013 | Higo et al. |
| 2013/0234121 A1 | 9/2013 | Sonoyama |
| 2014/0077196 A1 | 3/2014 | Shim |

FOREIGN PATENT DOCUMENTS

| | | |
|---|---|---|
| JP | 2005-331665 | 12/2005 |
| JP | 2006-134624 | 5/2006 |
| JP | 2007-234581 | 9/2007 |
| JP | 2008-243773 | 10/2008 |
| JP | 2009-176589 | 8/2009 |
| JP | 2010-050107 | 3/2010 |

OTHER PUBLICATIONS

International Search Report, mailed Nov. 30, 2010, for International Application No. PCT/JP2010/005219.

International Search Report, mailed Nov. 30, 2010, for International Application No. PCT/JP2010/005247.

* cited by examiner

FIG. 14A
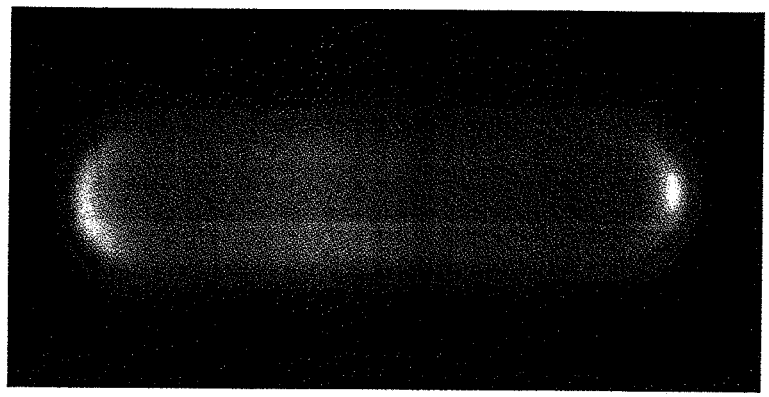
FIG. 14B
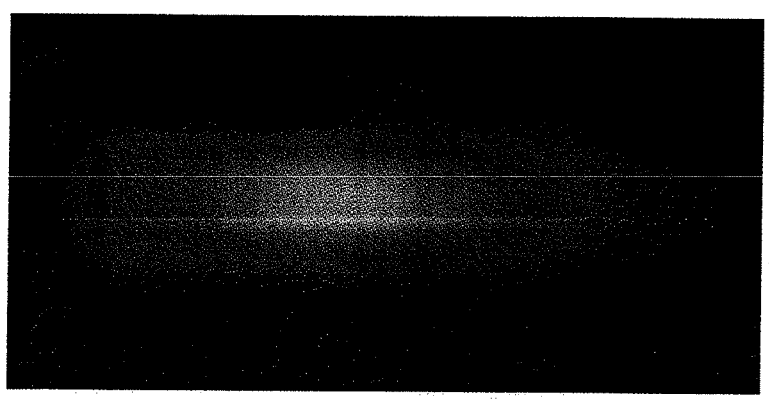
FIG. 14C
MAX　　　　　Luminance　　　　　0

ORGANIC LIGHT-EMITTING ELEMENT AND PROCESS FOR PRODUCTION THEREOF, AND ORGANIC DISPLAY PANEL AND ORGANIC DISPLAY DEVICE

This is a continuation application of PCT Application No. PCT/JP2010/005219 filed Aug. 25, 2010, designating the United States of America, the disclosure of which, including the specification, drawings and claims, is incorporated herein by reference in its entirety.

TECHNICAL FIELD

The present invention relates to an organic light-emitting element and a manufacturing method of the same, an organic display panel, and an organic display device.

BACKGROUND ART

In recent years, progress has been made in the research and development of display devices that use the phenomenon of electroluminescence occurring in organic material. Each light-emitting cell of such a display device is composed of an anode and a cathode with an organic light-emitting layer therebetween. When the display device is driven, holes are injected through the anode, electrons are injected through the cathode, and the holes and electrons recombine within the organic light-emitting layer, thereby emitting the light.

The organic light-emitting layer is formed by dripping ink that includes organic light-emitting material into regions separated by banks composed of insulating material and then drying the ink. The thickness of the organic light-emitting layer exhibits a correlation with luminance. Therefore, it is desirable to maintain the thickness of the organic light-emitting layer as uniform as possible.

To satisfy this desire, technology has for example been proposed to provide a gap between the bank and the anode provided therebelow in order to balance affinity and repellency in order to achieve uniformity in the thickness of the organic light-emitting layer (Patent Literature 1). Technology has also been proposed to apply surface treatment, such as oxygen plasma treatment, to the surface of the layer beneath the organic light-emitting layer and to apply surface treatment, such as $CF_4$ plasma treatment, to the surface of the bank in order to achieve uniformity in the thickness of the organic light-emitting layer formed in regions surrounded by these surfaces (Patent Literature 2).

CITATION LIST

Patent Literature

Patent Literature 1: Japanese Patent Application Publication No. 2006-134624
Patent Literature 2: Japanese Patent Application Publication No. 2004-127551

SUMMARY OF INVENTION

Technical Problem

The conventional technology in Patent Literatures 1 and 2, however, does not provide sufficient uniformity in the thickness of the organic light-emitting layer. Specifically, while Patent Literatures 1 and 2 rely on surface treatment of the surface of the bank and the like in order to balance affinity and repellency with respect to the ink that includes the organic light-emitting material, thereby promoting uniformity in the thickness of the organic light-emitting layer, there is a limit on the degree to which variation in the thickness of the organic light-emitting layer can be controlled during drying of the ink.

The present invention has been conceived to contribute towards a solution to the above problems, and it is an object thereof to provide an organic light-emitting element and manufacturing method of the same, an organic display panel, and an organic display device that promote uniformity in the thickness of the organic light-emitting layer and have high light-emitting characteristics and even luminance.

Solution to Problem

An organic light-emitting element according to an aspect of the present invention comprises: an underlayer including a substrate, a drive circuit formed on the substrate, and an interlayer insulating layer formed on the drive circuit; a first electrode formed above the underlayer; a functional layer formed above the first electrode; a plurality of banks which, formed above the first electrode, define an opening for a light-emitting cell, thereby separating the light-emitting cell from light-emitting cells adjacent thereto; a light-emitting layer formed, from ink containing an organic light-emitting material, in the opening above the functional layer; and a second electrode which, formed above the light-emitting layer, has opposite polarity from the first electrode.

The underlayer includes a first upper surface portion and a second upper surface portion, the first upper surface portion corresponding to an edge region of the light-emitting layer near a bank among the plurality of banks, the second upper surface portion corresponding to another region located away from the bank toward a center of the light-emitting layer, and the first upper surface portion is located higher than the second upper surface portion.

The first electrode extends along the first upper surface portion and the second upper surface portion of the underlayer, and includes a first upper surface portion and a second upper surface portion, the first upper surface portion corresponding to the edge region, the second upper surface portion corresponding to the another region, and the first upper surface portion of the first electrode is located higher than the second upper surface portion of the first electrode.

The functional layer extends along the first upper surface portion and the second upper surface portion of the first electrode, and includes a first upper surface portion and a second upper surface portion, the first upper surface portion corresponding to the edge region, the second upper surface portion corresponding to the another region, and the first upper surface portion of the functional layer is located higher than the second upper surface portion of the functional layer.

The light-emitting layer extends along the first upper surface portion and the second upper surface portion of the functional layer, and includes a first lower surface portion, a second lower surface portion, a first upper surface portion, and a second upper surface portion, the first lower surface portion being in contact with the functional layer and corresponding to the edge region, the second lower surface portion being in contact with the functional layer and corresponding to the another region, the first upper surface portion being provided on an opposite side from the functional layer and corresponding to the edge region, the second upper surface portion being provided on an opposite side from the functional layer and corresponding to the another region.

The first lower surface portion of the light-emitting layer is located higher than the second lower surface portion of the light-emitting layer, the first upper surface portion of the light-emitting layer is located higher than the second upper surface portion of the light-emitting layer, and a thickness of the light-emitting layer between the first lower surface portion and the first upper surface portion is equal to a thickness of the light-emitting layer between the second lower surface portion and the second upper surface portion.

Advantageous Effects of Invention

In the organic light-emitting element according to an aspect of the present invention, the functional layer extends along the first upper surface portion and the second upper surface portion of the first electrode, and the first upper surface portion of the functional layer is located higher than the second upper surface portion of the functional layer. Therefore, in the organic light-emitting element according to an aspect of the present invention, when ink is applied through the opening and dried to form the organic light-emitting layer, the thickness of the light-emitting layer at the edge region near the bank becomes equal to the thickness at the region located away from the bank toward the center of the light-emitting layer, thus yielding an equal thickness throughout the light-emitting cell.

As a result, in the organic light-emitting element according to an aspect of the present invention, the organic light-emitting layer is prevented from becoming thick in the edge regions near the banks, thus preventing the luminance from decreasing in these regions. This makes it easier to obtain uniform luminance throughout the entire light-emitting cell, thereby achieving excellent light-emitting characteristics.

Furthermore, in the organic light-emitting element according to an aspect of the present invention, the first and second lower surface portions of the organic light-emitting layer are in contact with the functional layer, which is made of the same material as the organic light-emitting layer. This improves wettability of the ink, thereby also contributing to excellent light-emitting characteristics.

Accordingly, the organic light-emitting element according to an aspect of the present invention promotes a uniform thickness of the light-emitting layer, thereby having even luminance and high light-emitting characteristics.

BRIEF DESCRIPTION OF DRAWINGS

FIGS. 14A, 14B, and 14C are schematic diagrams showing a luminance distribution in the subpixels of the display panel according to the reference example.

DESCRIPTION OF EMBODIMENTS

Figure 1:
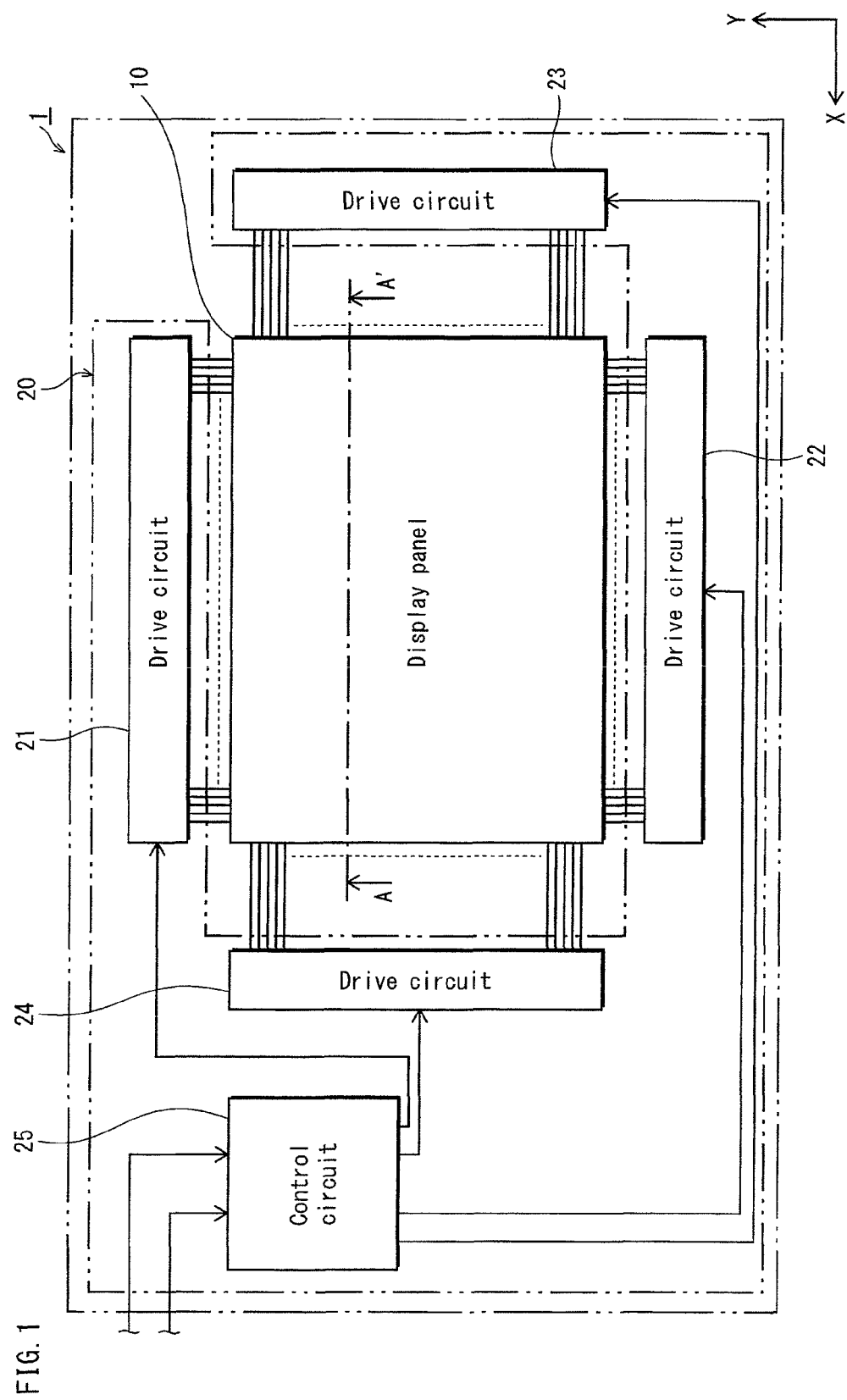
FIG. 1 is a block diagram showing the configuration of an organic display device 1 according to Embodiment 1.

Outline of an Aspect of the Present Invention

An organic light-emitting element according to an aspect of the present invention comprises: an underlayer including a substrate, a drive circuit formed on the substrate, and an interlayer insulating layer formed on the drive circuit; a first electrode formed above the underlayer; a functional layer formed above the first electrode; a plurality of banks which, formed above the first electrode, define an opening for a light-emitting cell, thereby separating the light-emitting cell from light-emitting cells adjacent thereto; a light-emitting layer formed, from ink containing an organic light-emitting material, in the opening above the functional layer; and a second electrode which, formed above the light-emitting layer, has opposite polarity from the first electrode.

The underlayer includes a first upper surface portion and a second upper surface portion, the first upper surface portion corresponding to an edge region of the light-emitting layer near a bank among the plurality of banks, the second upper surface portion corresponding to another region located away from the bank toward a center of the light-emitting layer, and the first upper surface portion is located higher than the second upper surface portion.

The first electrode extends along the first upper surface portion and the second upper surface portion of the underlayer, and includes a first upper surface portion and a second upper surface portion, the first upper surface portion corresponding to the edge region, the second upper surface portion corresponding to the another region, and the first upper surface portion of the first electrode is located higher than the second upper surface portion of the first electrode.

The functional layer extends along the first upper surface portion and the second upper surface portion of the first electrode, and includes a first upper surface portion and a second upper surface portion, the first upper surface portion corresponding to the edge region, the second upper surface portion corresponding to the another region, and the first upper surface portion of the functional layer is located higher than the second upper surface portion of the functional layer.

The light-emitting layer extends along the first upper surface portion and the second upper surface portion of the functional layer, and includes a first lower surface portion, a second lower surface portion, a first upper surface portion, and a second upper surface portion, the first lower surface portion being in contact with the functional layer and corresponding to the edge region, the second lower surface portion being in contact with the functional layer and corresponding to the another region, the first upper surface portion being provided on an opposite side from the functional layer and corresponding to the edge region, the second upper surface portion being provided on an opposite side from the functional layer and corresponding to the another region.

The first lower surface portion of the light-emitting layer is located higher than the second lower surface portion of the light-emitting layer, the first upper surface portion of the light-emitting layer is located higher than the second upper surface portion of the light-emitting layer, and a thickness of the light-emitting layer between the first lower surface portion and the first upper surface portion is equal to a thickness of the light-emitting layer between the second lower surface portion and the second upper surface portion.

In the organic light-emitting element according to an aspect of the present invention, the functional layer extends along the first upper surface portion and the second upper surface portion of the first electrode, and the first upper surface portion of the functional layer is located higher than the second upper surface portion of the functional layer. Therefore, in the organic light-emitting element according to an aspect of the present invention, when ink is applied through the opening and dried to form the organic light-emitting layer, the thickness of the light-emitting layer at the edge region near the bank becomes equal to the thickness at the region located away from the bank toward the center of the light-emitting layer, thus yielding an equal thickness throughout the light-emitting cell.

As a result, in the organic light-emitting element according to an aspect of the present invention, the organic light-emitting layer is prevented from becoming thick in the edge regions near the banks, thus preventing the luminance from decreasing in these regions. This makes it easier to obtain uniform luminance throughout the entire light-emitting cell, thereby achieving excellent light-emitting characteristics.

Furthermore, in the organic light-emitting element according to an aspect of the present invention, the first and second lower surface portions of the organic light-emitting layer are in contact with the functional layer, which is made of the same material as the organic light-emitting layer. This improves wettability of the ink, thereby also contributing to excellent light-emitting characteristics.

Accordingly, the organic light-emitting element according to an aspect of the present invention promotes a uniform thickness of the light-emitting layer, thereby having even luminance and high light-emitting characteristics.

Note that the word "equal" does not necessarily mean exact numerical equality. Rather, the range of "equal" values takes into consideration factors such as tolerance during manufacturing of the organic light-emitting element. Specifically, "equal" includes a range over which uneven luminance by the organic light-emitting element is allowed.

In the organic light-emitting element according to an aspect of the present invention, an upper surface portion of the light-emitting layer, including the first upper surface portion and the second upper surface portion, may be concave upward due to the first upper surface portion of the light-emitting layer being located higher than the second upper surface portion of the light-emitting layer, and a lower surface portion of the light-emitting layer, including the first lower surface portion and the second lower surface portion, may be convex downward due to the first lower surface portion of the light-emitting layer being located higher than the second lower surface portion of the light-emitting layer. With this structure, the upper surface portion of the light-emitting layer is concave upward, and the lower surface portion of the light-emitting layer is convex downward. Therefore, the thickness of the light-emitting layer is uniform throughout the light-emitting cell. The organic light-emitting element thus has even luminance and high light-emitting characteristics.

In the organic light-emitting element according to an aspect of the present invention, the first upper surface portion of the functional layer may be located higher than the second upper surface portion of the functional layer by at least 100 nm and at most 200 nm. Providing a difference in height between the first upper surface portion and the second upper surface portion of the functional layer within the above numerical range is preferable from the perspective of guaranteeing uniformity of the thickness of the light-emitting layer.

In the organic light-emitting element according to an aspect of the present invention, when viewing a cross-section of the light-emitting layer between the banks, a length of the first upper surface portion of the light-emitting layer may be at least 50 µm, a length of the second upper surface portion of the light-emitting layer may be at least 50 µm, the length of the first upper surface portion of the light-emitting layer may be at least ⅕ and at most ⅓ an entire length of each light-emitting cell, and the length of the second upper surface portion of the light-emitting layer may be at least ⅓ and at most ⅗ the entire length of each light-emitting cell. Stipulating these numerical ranges further promotes uniformity of the thickness of the light-emitting layer to a high degree of accuracy.

In the organic light-emitting element according to an aspect of the present invention, the interlayer insulating layer in the underlayer may include a first upper surface portion and a second upper surface portion, the first upper surface portion corresponding to the edge region, the second upper surface portion corresponding to the another region, and the first upper surface portion of the interlayer insulating layer may be located higher than the second upper surface portion of the interlayer insulating layer. With this structure where the interlayer insulating layer in the underlayer is provided with the first upper surface portion and the second upper surface portion, it is possible to prevent the light-emitting characteristics from decreasing and provide the light-emitting layer with uniform thickness in a reliable manner.

In the organic light-emitting element according to an aspect of the present invention, the second upper surface portion of the interlayer insulating layer may be flat, and the first upper surface portion of the interlayer insulating layer may have a level difference with respect to the second upper surface portion of the interlayer insulating layer, or may be formed as a step. This structure where the second upper surface portion of the first electrode is flat promotes uniformity of the thickness of the light-emitting layer and prevents collection of emitted light. This contributes to achievement of high light-emitting characteristics.

In the organic light-emitting element according to an aspect of the present invention, in the light-emitting layer, the another region may be centered between adjacent banks.

In the organic light-emitting element according to an aspect of the present invention, the light-emitting cells may be arrayed in two different directions (as a two dimensional array), the plurality of banks may be formed in the two different directions so as to separate adjacent light-emitting cells one from another, and the first upper surface portion and the second upper surface portion of the underlayer, the first upper surface portion and the second upper surface portion of the first electrode, the first upper surface portion and the second upper surface portion of the functional layer, and the first upper surface portion, the second upper surface portion, the first lower surface portion, and the second lower surface portion of the light-emitting layer may extend along a long axis direction of the light-emitting layer when viewing each light-emitting cell from above. When viewing each light-emitting cell from above in the long axis direction of the light-emitting layer, the thickness of the light-emitting layer tends to be uneven between the edge region near the bank and the central region between adjacent banks. With the above structure, however, the first upper surface portions and the second upper surface portions of each layer, as well as the first lower surface portion and the second lower surface portion of the light-emitting layer extend in the long axis direction of the light-emitting layer when viewing the light-emitting cell from above. This reliably promotes uniformity of the thickness of the light-emitting layer.

A method of manufacturing an organic light-emitting element according to an aspect of the present invention comprises the following steps.

(first step) forming a drive circuit on a substrate and forming an interlayer insulating layer on the drive circuit in order to form an underlayer that includes the substrate, the drive circuit and the interlayer insulating layer;

(second step) forming a first electrode above the underlayer;

(third step) forming a functional layer above the first electrode;

(fourth step) forming a plurality of banks above the first electrode to define an opening, thereby separating the light-emitting cell from light-emitting cells adjacent thereto;

(fifth step) forming a light-emitting layer in the opening above the functional layer by applying ink that includes an organic light-emitting material; and (sixth step) forming a second electrode, having opposite polarity from the first electrode, above the light-emitting layer.

In the organic light-emitting element manufacturing method according to an aspect of the present invention, in the second step, in the first step, the underlayer is formed so that the underlayer includes a first upper surface portion and a second upper surface portion, the first upper surface portion corresponding to an edge region of the light-emitting layer near a bank among the plurality of banks, the second upper surface portion corresponding to another region located away from the bank toward a center of the light-emitting layer, and the first upper surface portion is located higher than the second upper surface portion.

In the second step, the first electrode is formed to extend along the first upper surface portion and the second upper surface portion of the underlayer so that the first electrode includes a first upper surface portion and a second upper surface portion, the first upper surface portion corresponding to the edge region, the second upper surface portion corresponding to the another region, and the first upper surface portion of the first electrode is located higher than the second upper surface portion of the first electrode.

In the third step, the functional layer is formed to extend along the first upper surface portion and the second upper surface portion of the first electrode so that the functional layer includes a first upper surface portion and a second upper surface portion, the first upper surface portion corresponding to the edge region, the second upper surface portion corresponding to the another region, and the first upper surface portion of the functional layer is located higher than the second upper surface portion of the functional layer.

In the fifth step, the light-emitting layer is formed to extend along the first upper surface portion and the second upper surface portion of the functional layer so that the light-emitting layer includes a first lower surface portion, a second lower surface portion, a first upper surface portion, and a second upper surface portion, the first lower surface portion being in contact with the functional layer and corresponding to the edge region, the second lower surface portion being in contact with the functional layer and corresponding to the another region, the first upper surface portion being provided on an opposite side from the functional layer and corresponding to the edge region, the second upper surface portion being provided on an opposite side from the functional layer and corresponding to the another region, the first lower surface portion of the light-emitting layer is located higher than the second lower surface portion of the light-emitting layer, the first upper surface portion of the light-emitting layer is located higher than the second upper surface portion of the light-emitting layer, and a thickness of the light-emitting layer between the first lower surface portion and the first upper surface portion is equal to a thickness of the light-emitting layer between the second lower surface portion and the second upper surface portion.

In an organic light-emitting element manufactured with the above manufacturing method, the functional layer is formed to extend along the first upper surface portion and the second upper surface portion of the first electrode so that the first upper surface portion of the functional layer is located higher than the second upper surface portion of the functional layer. As a result, in this organic light-emitting element, when ink is applied through the opening and dried to form the organic light-emitting layer, the thickness of the organic light-emitting layer in the edge region near the banks becomes equal to the thickness at the region located away from the edge region, thus yielding an equal thickness throughout the light-emitting cell. Therefore, the organic light-emitting layer is prevented from becoming thick in the edge regions near the banks, thus preventing the luminance from decreasing in these regions. This makes it easier to obtain uniform luminance throughout the entire light-emitting cell, thereby achieving excellent light-emitting characteristics.

Furthermore, in the organic light-emitting element manufactured with the above manufacturing method, the first and second lower surface portions of the organic light-emitting layer are in contact with the functional layer, which is made of the same material as the organic light-emitting layer. This improves wettability of the ink, thereby also contributing to excellent light-emitting characteristics.

Accordingly, the organic light-emitting element manufacturing method according to an aspect of the present invention provides a light-emitting layer with improved uniformity in the thickness, thereby allowing for manufacture of an organic light-emitting element with even luminance and high light-emitting characteristics.

Note that as described above, the word "equal" does not necessarily mean exact numerical equality. Rather, the range of "equal" values takes into consideration factors such as tolerance during manufacturing of the organic light-emitting element. Specifically, "equal" includes a range over which uneven luminance by the organic light-emitting element is allowed.

In the organic light-emitting element manufacturing method according to an aspect of the present invention, in the first step, the interlayer insulating layer may be formed so that the interlayer insulating layer includes a first upper surface portion and a second upper surface portion, the first upper surface portion corresponding to the edge region, the second upper surface portion corresponding to the another region, and the first upper surface portion of the interlayer insulating layer is located higher than the second upper surface portion of the interlayer insulating layer. With this structure where the interlayer insulating layer in the underlayer is provided with the first upper surface portion and the second upper surface portion, it is possible to prevent the light-emitting characteristics from decreasing, provide the light-emitting layer with uniform thickness in a reliable manner, and manufacture an organic light-emitting element with excellent light-emitting characteristics.

In the organic light-emitting element manufacturing method according to an aspect of the present invention, in the first step, the interlayer insulating layer may be formed by forming an insulating film from a photosensitive, insulating resin material, causing the insulating film to be exposed selectively, and then developing the selectively exposed insulating film. With this structure where the insulating film is exposed selectively depending on the region and theft developed, it is possible to form the interlayer insulating layer provided with the first upper surface portion and the second upper surface portion in a reliable manner. This makes it possible to manufacture an organic light-emitting element which is provided with a light-emitting layer with uniform thickness and has excellent light-emitting characteristics.

In the organic light-emitting element manufacturing method according to an aspect of the present invention, in the first step, the interlayer insulating layer may be formed by causing a portion of the insulating film corresponding to the first upper layer of the interlayer insulating layer to be exposed to an amount of light that is smaller than an amount of light to which another portion of the insulating film corresponding to the second upper layer of the interlayer insulating layer is exposed, and then developing the exposed insulating film, as a more specific manufacturing method.

An organic display panel according to an aspect of the present invention includes an organic light-emitting element manufactured by the organic light-emitting element manufacturing method according to an aspect of the present invention. With the structure, the organic display panel according to an aspect of the present invention provides a light-emitting layer with uniform thickness, thus achieving excellent light-emitting characteristics.

An organic display device according to an aspect of the present invention includes an organic light-emitting element manufactured by the organic light-emitting element manufacturing method according to an aspect of the present invention. With the structure, the organic display device according to an aspect of the present invention provides a light-emitting layer with uniform thickness, thus achieving excellent light-emitting characteristics.

Note that in this specification, it is preferable that among the first upper surface portions and the second upper surface portions of the various layers, at least the second upper surface portions be flat.

Process by which the Present Invention was Achieved

Figure 12:
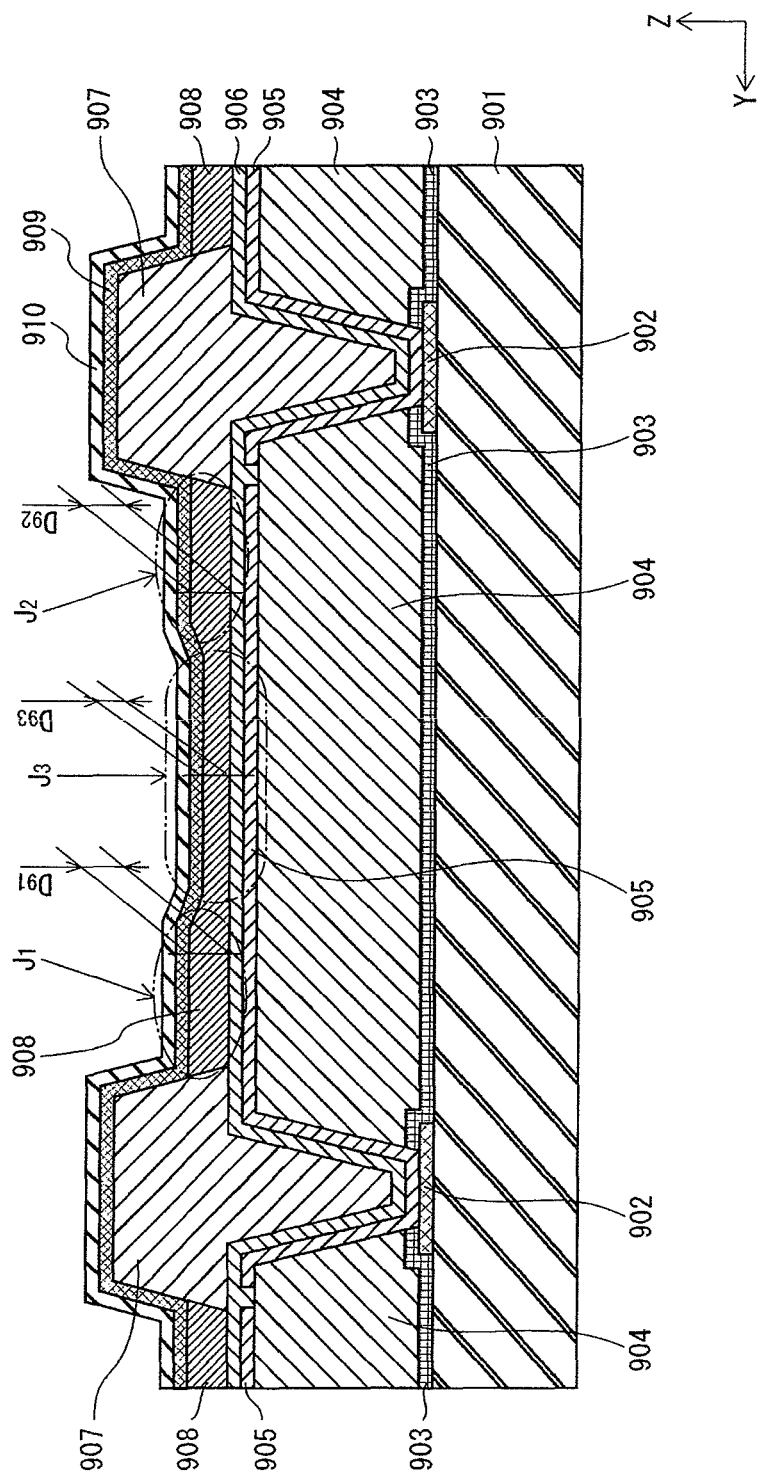
FIG. 12 is a schematic cross-section diagram showing a subpixel in a display panel according to a reference example.

As shown in FIG. 12, a display panel includes a substrate 901 on which a TFT layer 902 is formed as a drive circuit (in FIG. 12, only the drain electrode of the TFT layer 902 is shown). A passivation layer 903 is formed to cover the TFT layer 902. An interlayer insulating layer 904 is layered on the passivation layer 903 in the Z axis direction. An anode 905 and a hole injection transporting layer 906 are layered in this order on the interlayer insulating layer 904. The anode 905, provided independently in each subpixel, is connected to the TFT layer 902 via a contact hole formed in the interlayer insulating layer 904.

A bank 907 defining subpixels is provided on the hole injection transporting layer 906. An organic light-emitting layer 908 is formed in each region separated by the bank 907. On the exposed surface of the organic light-emitting layer 908 and the bank 907, a cathode 909 and a sealing layer 910 are layered in this order.

Figure 13A:
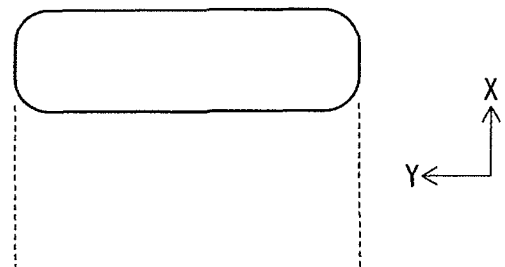
FIGS. 13A, 13B, 13C, and 13D are schematic diagrams showing the surface profile of the organic light-emitting layer in each subpixel of the display panel according to the reference example.

As shown in FIG. 13A, each subpixel is rectangular, being longer in the Y-axis direction than the width in the X-axis direction. FIG. 12 shows a cross-section of a subpixel in the Y-axis direction (the long axis direction).

As shown in FIG. 12, in the organic light-emitting layer 908, thicknesses $D_{91}$ and $D_{92}$ at edge regions near the banks 907 at either side in the Y-axis direction (regions $J_1$ and $J_2$) tend to be thicker than the thickness $D_{93}$ at a central region (region $J_3$). The difference between the thicknesses $D_{91}$ and $D_{92}$ and the thickness $D_{93}$ in the organic light-emitting layer 908 is inferred to be caused during the process of forming the organic light-emitting layer 908, from the application of ink through drying.

Figure 13B:
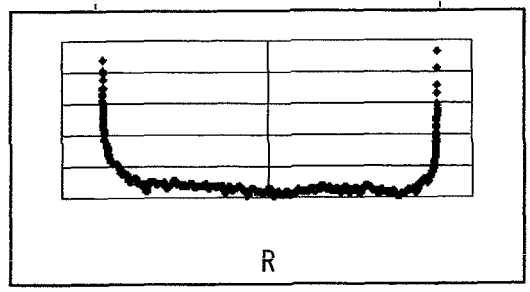
Figure 13C:
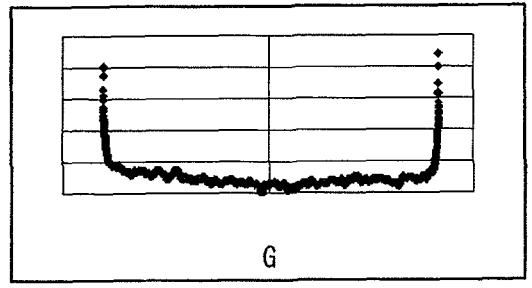
Figure 13D:
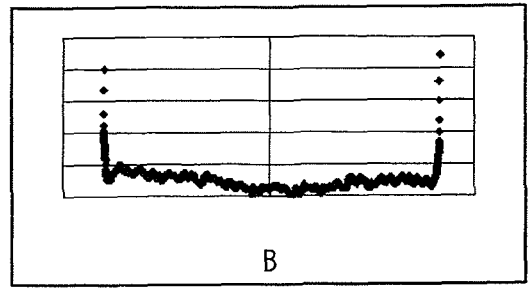

As shown in FIGS. 13B through 13D, the tendency for the thickness of the organic light-emitting layer to increase near the banks 907, i.e. in the edge regions in the long axis direction of the subpixel, is the same for all colors, red (R), green (G), and blue (B). The upper surface portion of the organic light-emitting layer 908 of any color of light is located higher in edge regions near the banks 907 than in the central region of the subpixel.

When the thickness of the organic light-emitting layer 908 is not uniform, as in the above case, luminance becomes uneven, leading to a decrease in light-emitting characteristics, as in the red (R) subpixel shown in FIG. 14A, the green (G) subpixel shown in FIG. 14B, and the blue (B) subpixel shown in FIG. 14C. This situation also causes problems such as reduced luminous efficiency and a decrease in service life.

Based on the above considerations, the inventors developed a technical feature for promoting uniformity in the thickness of the organic light-emitting layer that is formed on the functional layer in each subpixel of the display panel. Specifically, the upper surface portion of the underlayer, which includes the interlayer insulating layer, is formed to include a first upper surface portion and a second upper surface portion having different heights, and the first electrode (an electrode at a lower location) and the functional layer (including the hole injection transporting layer) are formed to extend along the shape of the upper surface portion of the underlayer.

Figure 15A:
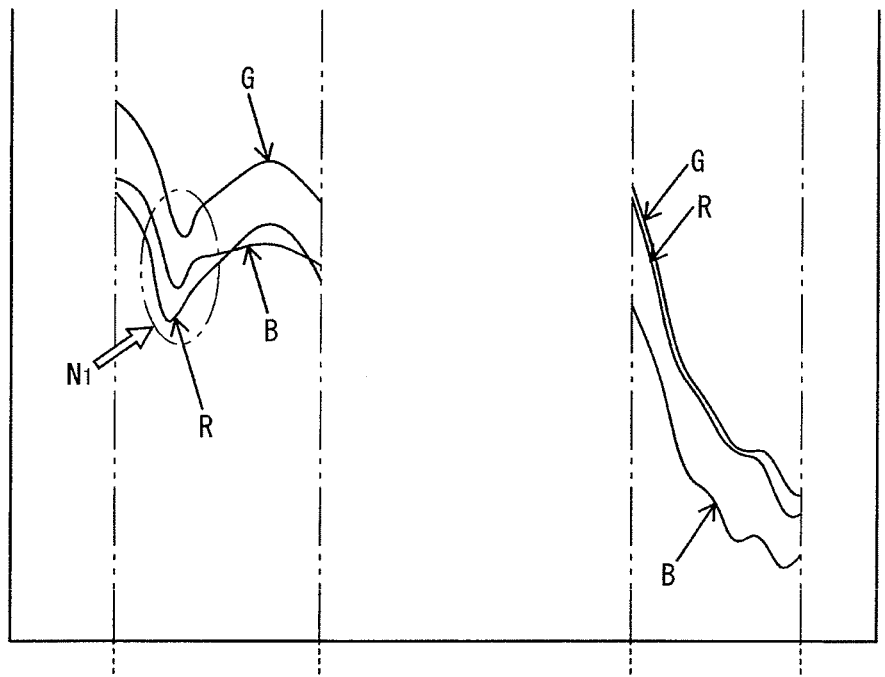
FIGS. 15A, 15B, and 15C are schematic diagrams showing the surface profile of regions in an underlayer of the display panel according to the reference example and the luminance distribution in those regions.

The conclusions drawn from considering the relationship between luminance and the surface (upper surface portion) profile of the underlayer including the interlayer insulating layer are described with reference to FIGS. 15A through 15C. FIG. 15A shows the surface (upper surface portion) profile of the underlayer in partial regions (region $M_1$ and region $M_2$) of the subpixel. Specifically, this surface profile corresponds to regions taken along the line K-K' illustrated in FIG. 15B. In FIG. 15A, the vertical axis represents the thickness of the underlayer, with thickness increasing higher up the vertical axis. The horizontal axis represents the corresponding region of the underlayer.

Figure 15B:
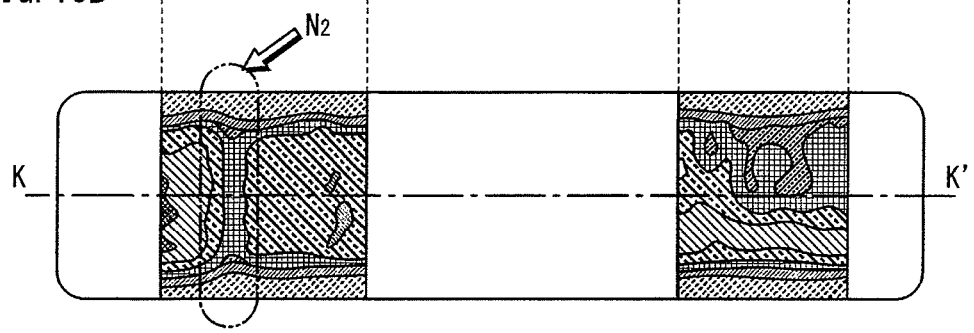
Figure 15C:
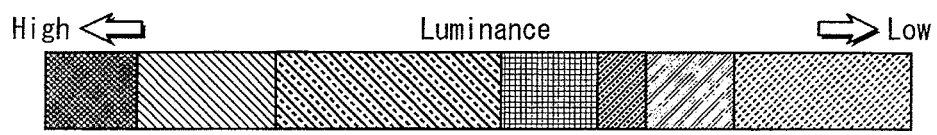

FIG. 15B shows a luminance distribution in the above partial regions (region $M_1$ and region $M_2$), using a blue (B) subpixel as an example. FIG. 15C indicates the luminance levels depicted in FIG. 15B.

In the region M, shown in FIG. 15A, the surface profile of the underlayer is curved, but as shown in FIG. 15B, the luminance in the corresponding region (region $M_2$) is approximately uniform. Accordingly, as in the region $M_2$ in FIG. 15A, when the surface profile of the underlayer is curved, the light-emitting layer can be considered to be thicker in the edges of the subpixel than in the central region.

On the other hand, as in the region $M_1$ in FIG. 15A, when the surface profile of the underlayer changes approximately continuously by a step or a level difference, then as shown in FIG. 15B, the luminance in the corresponding region (region $M_1$) changes. Specifically, in a region in which the underlayer is thin and the surface profile is low, as in the region $N_1$ of FIG. 15A circled by a two-dot chain line, luminance is low as in the region $N_2$ of FIG. 15B which is also circled by a two-dot chain line. In other words, a relationship is considered to exist whereby the underlayer is not thinner at a portion where luminance is high than at a portion where luminance is low.

Accordingly, as described above, it is preferable to adopt a structure where the second upper surface portion (upper surface portion in the central region) of the underlayer including the interlayer insulating layer is flat, and the first upper surface portion (upper surface portions in the edges) has a level difference with respect to the second upper surface portion, or is formed as a step. By adopting this sort of structure, the thickness of the light-emitting layer in the subpixel can be made uniform, thus achieving high light-emitting characteristics.

Embodiment 1

1. Configuration of Display Device 1

The overall structure of the display device 1 according to the present Embodiment is described with reference to FIG. 1.

As shown in FIG. 1, the display device (organic display device) 1 is composed of a display panel (organic display panel) 10 and a drive control unit 20 connected to the display panel 10. The display panel 10 is an organic display panel using the phenomenon of electroluminescence of organic material. A plurality of pixels are arranged in a two-dimensional matrix in the X and Y directions.

The drive control unit 20 is composed of four drive circuits 21-24 and a control circuit 25.

Note that in an actual display device 1, the placement of the drive control unit 20 with respect to the display panel 10 is not limited in this way.

2. Structure of Display Panel 10

Figure 2:
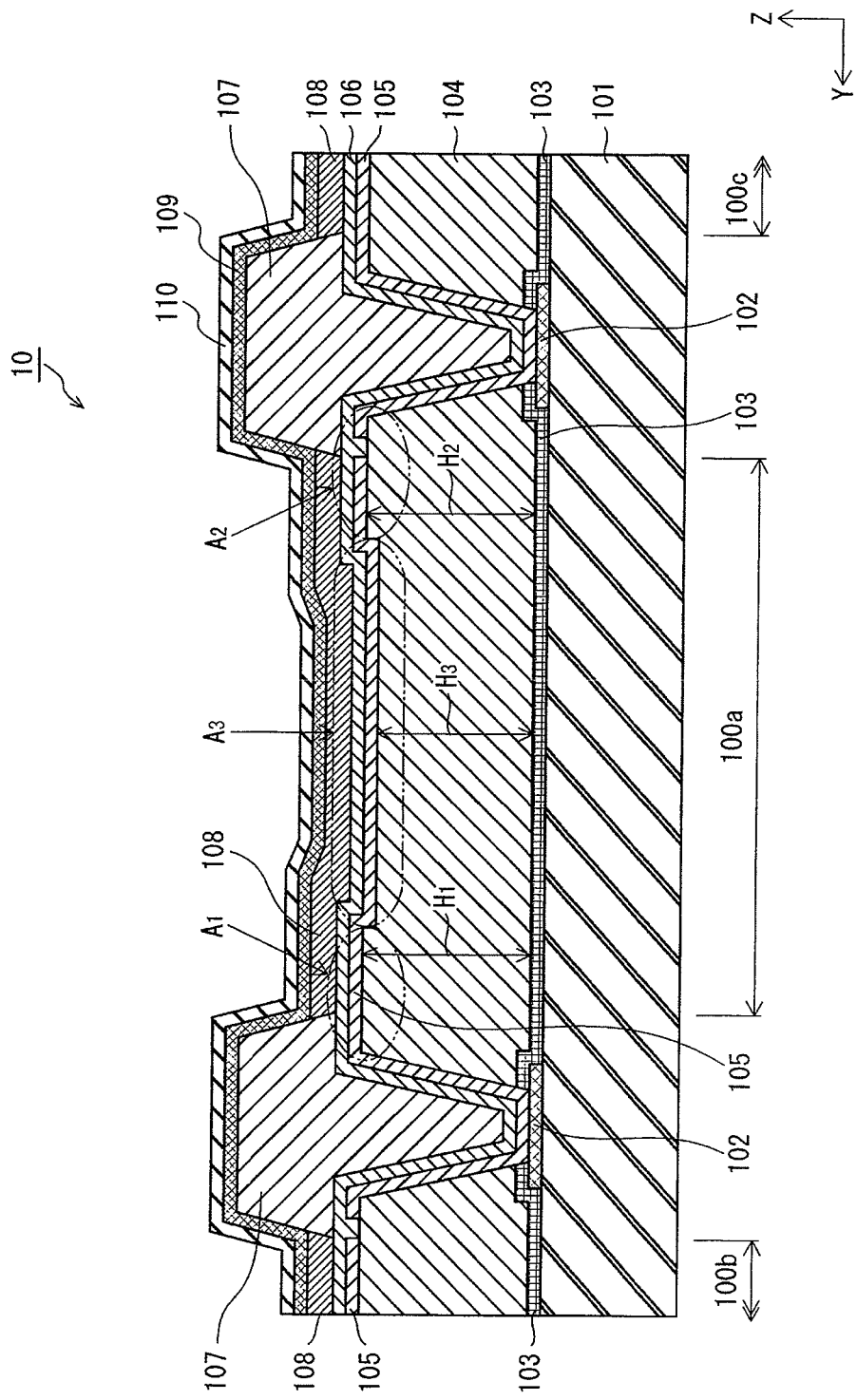
FIG. 2 is a schematic cross-section diagram showing a subpixel 100a in the organic display panel 10.

The structure of the display panel 10 is described with reference to FIG. 2. As an example, the display panel 10 in the present Embodiment is a top emission type organic EL panel composed of a plurality of pixels arranged in a matrix, each pixel provided with organic light-emitting layers respectively having luminescent colors of red (R), green (G) and blue (B). FIG. 2 illustrates a subpixel 100a, one of three adjacent subpixels 100a, 100b and 100c.

As shown in FIG. 2, the display panel 10 has a TFT layer 102, which is a drive circuit, formed on the substrate 101 in the Z-axis direction. Note that in FIG. 2, only the drain electrode among the constituent elements of the TFT layer 102 is shown. A passivation layer 103 is formed on the TFT layer 102 and on the substrate 101. The passivation layer 103 has openings to expose portions of the TFT layer 102.

An interlayer insulating layer 104, an anode 105 and a hole injection transporting layer 106 are layered in this order on the passivation layer 103. The anode 105 is provided separately for each of the subpixels 100a, 100b, and 100c.

A bank 107, formed from an insulating material, is provided on the hole injection transporting layer 106 to separate the subpixels 100a, 100b, and 100c one from another. An organic light-emitting layer 108 is formed in each region separated by the bank 107, and a cathode 109 and sealing layer 110 are layered on the organic light-emitting layer 108 in this order. The main constituent elements are, for example, formed from the following materials.

a) Substrate 101

The substrate 101 is formed with a base of an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, alumina, etc.

b) Interlayer insulating layer 104

The interlayer insulating layer 104 is formed from an organic compound such as polyimide, polyamide, or an acrylic resin material.

c) Anode 105

The anode 105 is composed of a single layer or of a laminate of a plurality of layers of a conductive material, such as Al (aluminum) or an aluminum alloy, Ag (silver), APC (alloy of silver, palladium, and copper), ARA (alloy of silver, rubidium, and gold), MoCr (alloy of molybdenum and chromium), NiCr (alloy of nickel and chromium), etc. Note that in the case of a top emission type panel such as in the present embodiment, it is preferable that the anode 105 be formed with highly reflective material.

A transparent coating layer formed from, for example, indium tin oxide (ITO) may be included in the upper layer portion of the anode 105.

d) Hole Injection Transporting Layer 106

The hole injection transporting layer 106 is a layer formed from an oxide of a metal such as silver (Ag), molybdenum (Mo), chromium (Cr), vanadium (V), tungsten (W), nickel (Ni), or iridium (Ir), or formed from a conductive polymer material, such as PEDOT (a mixture of polythiophene and polystyrene sulfonate). The hole injection transporting layer 106 formed from such a metal oxide, among the above materials, has the function of assisting with generation of holes and injecting and transporting the holes stably into the organic light-emitting layer 108. The hole injection transporting layer 104 has a high work function.

When the hole injection transporting layer 106 is formed from an oxide of a transition metal, a plurality of levels can be occupied since there are a plurality of oxidation numbers. This makes hole injection easy and allows for reduction of driving voltage.

e) Bank 107

The bank 107 is formed with an organic material, such as resin, and has insulating properties. Examples of the organic material used to form the bank 107 include acrylic resin, polyimide resin, styrenic resin, polycarbonate resin, novolactype phenolic resin, and the like. It is also preferable that the bank 107 have organic solvent resistance.

Furthermore, since the bank 107 is etched and baked when formed, it is preferable that the bank be formed from highly resistant material that will not change in shape or quality during the etching and baking processes. To provide the bank with liquid repellency, the side walls can be fluorinated.

Note that as the insulating material used in forming the bank 107, in particular any liquid repellent material with a resistivity of $10^5$ Ω·cm or greater can be used, as well as the above materials. This is because using a material with a resistivity of less than $10^5$ Ω·cm leads to production of leak current between the anode 105 and the cathode 109, or between adjacent subpixels 100a, 100b and 100c, which causes a variety of problems such as increased power consumption.

Furthermore, if a hydrophilic material is used to form the bank 107, then the difference in liquid affinity/repellency between the side wall of the bank 107 and the surface of the hole injection transporting layer 106 becomes small, and it thus becomes difficult to selectively maintain the ink, which includes an organic substance for forming the organic light-emitting layer 108, at the opening of the bank 107.

The structure of the bank 107 need not be a single layer as shown in FIG. 2, but may adopt a two or more layered structure. In such a case, the above materials may be combined for each layer, or a non-organic and/or an organic material may be used for each layer.

f) Organic Light-Emitting Layer 108

The organic light-emitting layer 108 has a function of emitting light when an excitation state is produced by the recombination of holes injected through the anode 105 with electrons injected through the cathode 109. The material used to form the organic light-emitting layer 108 needs to be a light emitting organic material, a film of which can be formed by wet printing.

Specifically, it is preferable that the organic light emitting layer 106 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, or the like, as recited in Japanese Patent Application Publication No. H5-163488.

g) Cathode 109

The cathode 109 is formed, for example, of ITO, indium zinc oxide (IZO), or the like. In the case of the top-emission type display panel 10, it is preferable that the cathode 109 be formed with a light-transmissive material. It is preferable that the degree of light transmissivity be 80% or greater.

The material used to form the cathode 109 may, in addition to the above materials, be for example an alkali metal or alkali earth metal, or a laminate structure having, in the following order, a layer that includes a halide of an alkali metal or alkali earth metal and a layer that includes silver. The layer that includes silver may be formed with silver alone, or with a silver alloy. Also, in order to increase light extraction efficiency, a highly transparent refraction index adjustment layer may be provided above the layer that includes silver.

An electron injection layer may also be inserted between the organic light-emitting layer 108 and the cathode 109.

The electron injection layer has the function of transporting electrons injected through the cathode 109 to the organic light-emitting layer 108 and is preferably formed, for example, of barium, phthalocyanine, lithium fluoride, or a combination thereof.

h) Sealing Layer 110

The sealing layer 110 has the function of restricting the organic light-emitting layer 108 or other layers from being exposed to water or air and is formed from, for example, silicon nitride (SiN) or silicon oxynitride (SiON). In the case of the top-emission type display panel 10, it is preferable that the sealing layer 110 be formed with a light-transmissive material.

3. Structure of Bank 107

Figure 3:
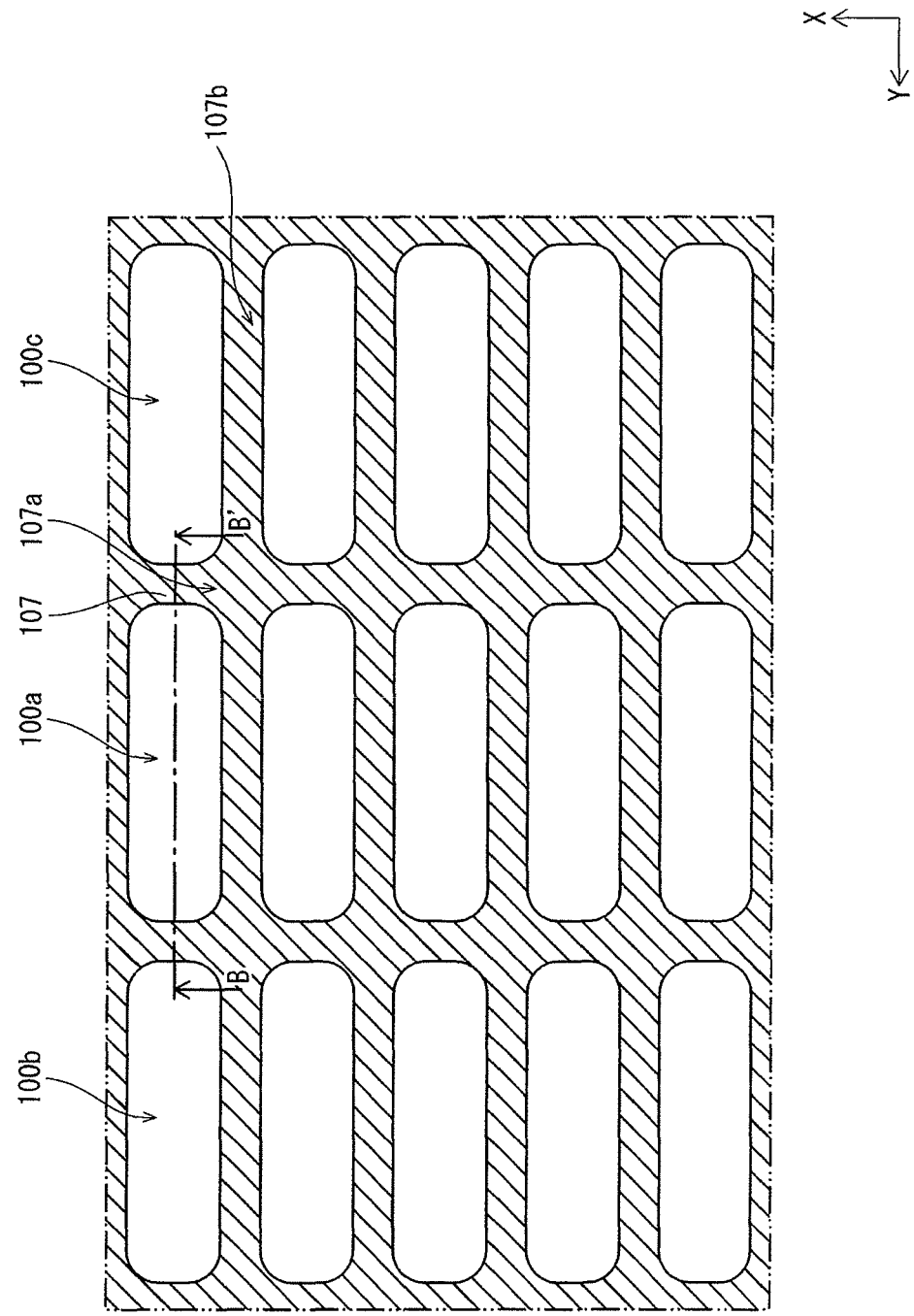
FIG. 3 is a schematic plan view showing a portion of a bank 107 in the display panel 10.

As shown in FIG. 3, in the display panel 10 according to the present embodiment, the bank 107 is a so-called pixel bank that defines the subpixels 100a, 100b and 100c into approximately rectangular regions. Specifically, the bank 107 is integrally formed from portions 107a that extend in the X-axis direction and portions 107b that extend in the Y-axis direction. Three subpixels that are adjacent in the X-axis direction and belong to the same column (a red (R) subpixel, a green (G) subpixel, and a blue (B) subpixel) together form one pixel.

Note that the cross-section shown in FIG. 2 is taken along the line C-C' illustrated in FIG. 3. In other words, FIG. 2 shows a cross-section of the subpixel 100a taken along the long axis direction (the Y-axis direction) thereof.

4. Shape of Interlayer Insulating Layer 104 and Thickness of Organic Light-Emitting Layer 108

Back to FIG. 2, in the subpixel 100a, thickness $H_1$ and $H_2$ of the interlayer insulating layer 104 at edge regions (regions $A_1$ and $A_2$) near banks 107 is greater than a thickness $H_3$ at a central region (region $A_3$) between the banks 107.

Figure 4:
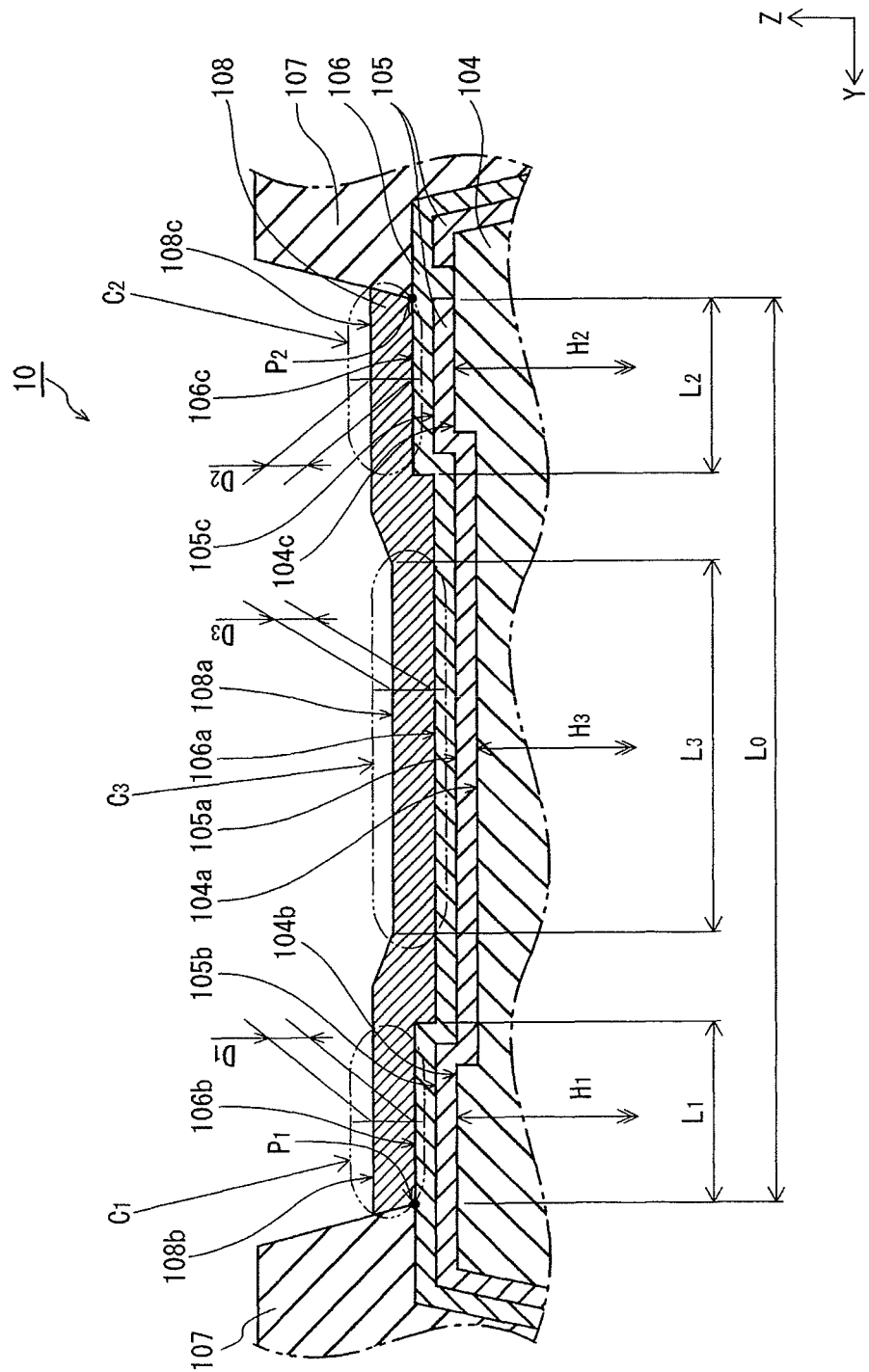
FIG. 4 is a schematic cross-section diagram showing the shape of an interlayer insulating layer 104, an anode 105, a hole injection transporting layer 106, and an organic light-emitting layer 108.

Also, as shown in FIG. 4, due to the difference between the thicknesses $H_1$ and $H_2$ and the thickness $H_3$, upper surface portions 104b and 104c of the interlayer insulating layer 104 in the edge regions near banks 107 are located higher in the Z-axis direction than an upper surface portion 104a in the central region. The anode 105 is formed as a layer on the interlayer insulating layer 104 to extend along the upper surface portions 104a, 104b and 104c and has an approximately uniform thickness. Accordingly, upper surface portions 105b and 105c of the anode 105 in the edge regions near banks 107 are located higher in the Z-axis direction than an upper surface portion 105a in the central region.

The hole injection transporting layer 106 is formed as a layer on the anode 105 to extend along the upper surface portions 105a, 105b, and 105c and has an approximately uniform thickness. Therefore, upper surface portions 106b and 106c in the edge regions near the banks 107 are located higher in the Z-axis direction than an upper surface portion 106a in the central region.

As for the organic light-emitting layer 108 layered on the hole injection transporting layer 106, as described above, upper surface portions 108b and 108c in the edge regions (regions $C_1$ and $C_2$) near the banks 107 are located higher in the Z-axis direction than an upper surface portion 108a in the central region (region $C_3$).

In the present embodiment, as shown in FIG. 4, the upper surface portions 106b and 106c of the hole injection transporting layer 106 in the edge regions near the banks 107 are located higher in the Z-axis direction than the upper surface portion 106a in the central region. Therefore, lower surface portions of the organic light-emitting layer 108 in the edge regions (which are in contact with and thus can be regarded to be equal to the upper surface portions 106b and 106c of the hole injection transporting layer 106) are located higher in the Z-axis direction than a lower surface portion in the central region (which, similarly, can be regarded to be equal to the upper surface portion 106a of the hole injection transporting layer 106). As a result, the thicknesses $D_1$ and $D_2$ of the organic light-emitting layer 108 in the edge regions (regions $C_1$ and $C_2$) are equal to the thickness $D_3$ in the central region (region $C_3$).

When viewed as a whole, the upper surface portion of the organic light-emitting layer 108 is concave upward in the Z-axis direction, and the lower surface is convex downward in the Z-axis direction.

Note that the word "equal" does not necessarily mean exact numerical equality. Rather, the range of "equal" values takes into consideration factors such as tolerance during manufacturing of the organic light-emitting element. Specifically, "equal" includes a range over which uneven luminance by the organic light-emitting element is allowed.

In the hole injection transporting layer 106, the upper surface portions 106b and 106c in the edge regions (regions $C_1$ and $C_2$) near the banks 107 are located higher in the Z-axis direction than the upper surface portion 106a in the central region (region $C_3$) by at least 100 nm and at most 200 nm. This allows for the thicknesses $D_1$, $D_2$ and $D_3$, of the organic light-emitting layer 108 to be reliably made uniform.

In terms of promoting uniformity of the thicknesses $D_1$, $D_2$ and $D_3$ of the organic light-emitting layer 108, it is also preferable that each of the upper surface portions 108b and 108c in the edge regions (regions $C_1$ and $C_2$) near the banks 107 be at least 50 μm long in the Y-axis direction. Similarly, in terms of promoting uniformity of the thicknesses $D_1$, $D_2$ and $D_3$ of the organic light-emitting layer 108, it is also preferable that the upper surface portion 108a in the central region (region $C_3$) be at least 50 μm long in the Y-axis direction.

Letting the length of the subpixel in the Y-axis direction $L_0$ be defined as the distance between intersection points $P_1$ and $P^2$, at which inclined faces of the banks 107 meet the upper surface portions 106b and 106c of the hole injection transporting layer 106, then in terms of promoting uniformity of the thicknesses $D_1$, $D_2$ and $D_3$ of the organic light-emitting layer 108, it is preferable that each of the upper surface portions 108b and 108c in the edge regions (regions $C_1$ and $C_2$) near the banks 107 be at least ⅕ and at most ⅓ the length $L_0$. Similarly, in terms of promoting uniformity of the thicknesses $D_1$, $D_2$ and $D_3$ of the organic light-emitting layer 108, it is also preferable that the upper surface portion 108a in the central region (region $C_3$) be at least ⅓ and at most ⅗ the length $L_0$.

5. Advantageous Effects

In the organic display device 1 and the display panel 10 according to Embodiment 1, the thicknesses $D_1$, $D_2$ and $D_3$ of the organic light-emitting layer 108 are equal in each of the subpixels 100a, 100b, and 100c. As a result, in the display panel 10, the organic light-emitting layer 108 in each of the subpixels 100a, 100b, and 100c is prevented from becoming thick in the edge regions (regions $C_1$ and $C_2$) near the banks 107, thus preventing the luminance from decreasing in these regions. This makes it easier to obtain uniform luminance throughout the subpixels 100a, 100b, and 100c, thereby achieving excellent light-emitting characteristics.

In the display panel 10, the lower surface portion of the organic light-emitting layer 108 is in contact with the hole injection transporting layer 106, which is made of the same material as the organic light-emitting layer 108, in the edge regions (regions $C_1$ and $C_2$) near the banks 107 and in the central region (region $C_3$). This improves wettability of the ink, thereby also contributing to excellent light-emitting characteristics.

Accordingly, the organic display device 1 and the display panel 10 according to Embodiment 1 promote a uniform thickness of the organic light-emitting layer 108 throughout the subpixels 100a, 100b, and 100c including the thicknesses $D_1$, $D_2$ and $D_3$. The organic display device 1 and the display panel 10 thus have even luminance and high light-emitting characteristics.

6. Manufacturing Method

The main portions of a manufacturing method of the display panel 10 are described with reference to FIGS. 5A through 7C.

Figure 5A:
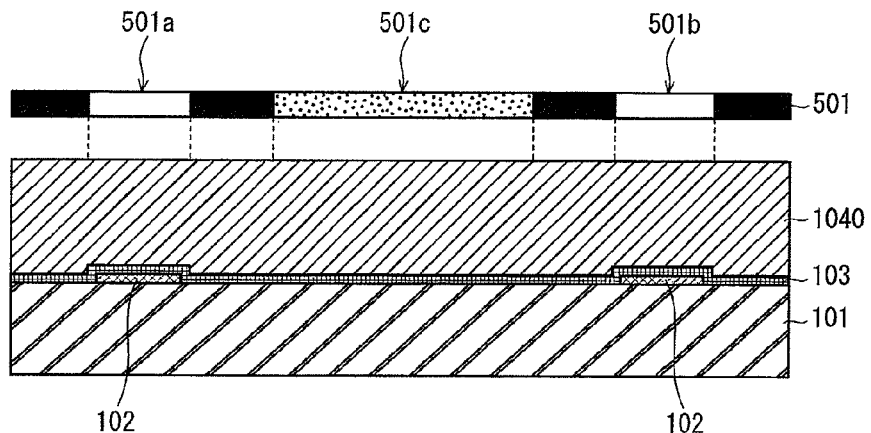
FIGS. 5A, 5B, and 5C are schematic cross-section diagrams showing, in order, the main processes in the manufacturing method of the display panel 10.

As shown in FIG. 5A, the TFT layer 102 is formed on the main upper (in the Z-axis direction) surface of the substrate 101. Note here that, in FIGS. 5A through 7C, only the drain electrode of the TFT layer 102 is shown. Next, the passivation layer 103 is formed thereon to cover the main upper surface of the substrate 101 and the TFT layer 102. An insulating film 1040 made of an organic compound (such as polyimide, polyamide or the like) is formed as a layer on the passivation layer 103. After the insulating film 1040 is formed, a mask 501 having light-transmissive sections 501a, 501b and 501c is laid.

In the mask 501, the light-transmissive section 501c is set to be lower in light transmissivity than the light-transmissive sections 501a and 501b.

Figure 5B:
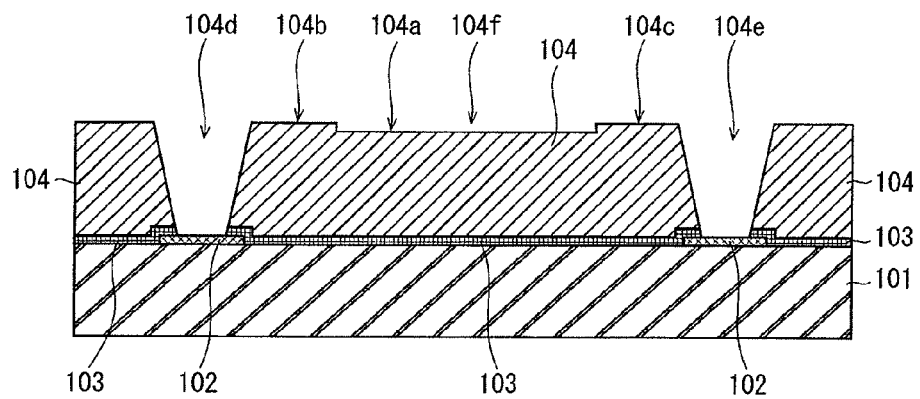

In the state shown in FIG. 5A, exposure is performed, followed by developing and baking. With these processes, as illustrated in FIG. 5B, contact holes 104d and 104e are formed respectively above the drain electrodes of the TFT layer 102. Also, a concave 104f is formed in an intermediate region between the contact holes 104d and 104e. The interlayer insulating layer 104 is formed such that an upper surface portion 104a, which is a bottom of the concave 104f, differs in height from upper surface portions 104b and 104c that are adjacent to the upper surface portion 104a in the Y-axis direction, by at least 100 nm and at most 200 nm.

Note that, as illustrated in FIG. 5B, parts of the passivation layer 103 respectively at the bottoms of the contact holes 104d and 104e are also removed in the above processes so that parts of the drain electrodes of the TFT layer 102 are exposed.

Figure 5C:
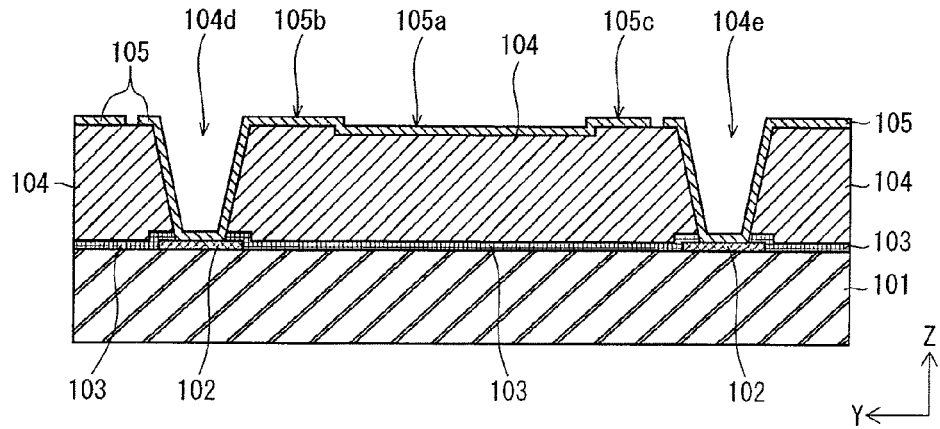

Subsequently, as illustrated in FIG. 5C, the anode 105 is formed as a layer on the surface of the interlayer insulating layer 104. The anode 105 is formed by first forming a layer of a conductive material (such as aluminum (Al) or an alloy including aluminum) on the surface of the interlayer insulating layer 104 by the sputtering method or the vacuum deposition method, and then performing a patterning in units of subpixels. Note that Indium Tin Oxide (ITO) or the like may be further layered on a metal portion that is made of the above conductive material.

The anode 105, which is formed on the interlayer insulating layer 104, extends along the shape of the surface of the interlayer insulating layer 104 including the concave 104f. Thus the anode 105 is formed such that an upper surface portion 105a, which is to be the central region of the subpixel, differs in height from upper surface portions 105b and 105c that are adjacent to the upper surface portion 105a in the Y-axis direction. More specifically, in the anode 105, the upper surface portions 105b and 105c are located higher than the upper surface portion 105a in the Z-axis direction.

Note that, as illustrated in FIG. 5C, in the bottoms of the contact holes 104d and 104e, the anode 105 is connected to the drain electrodes of the TFT layer 102.

Figure 6A:
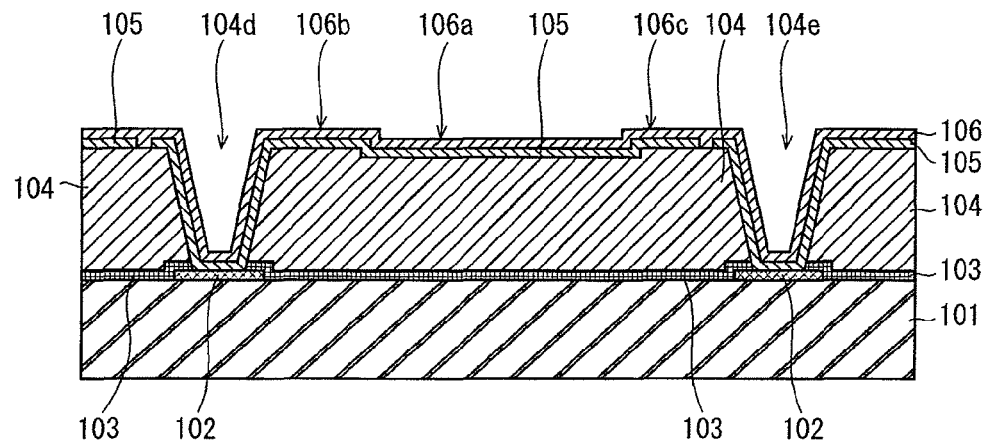
FIGS. 6A, 6B, and 6C are schematic cross-section diagrams showing, in order, the main processes in the manufacturing method of the display panel 10.

As shown in FIG. 6A, the hole injection transporting layer 106 is then layered to cover the anode 105 and certain portions of the interlayer insulating layer 104 that have been exposed by the patterning of the anode 105. The hole injection transporting layer 106 also extends along the shape of the surface of the interlayer insulating layer 104 including the concave 104f. Thus the hole injection transporting layer 106 is formed such that an upper surface portion 106a, formed on the upper surface portion 105a of the anode 105, differs in height in the Z-axis direction from upper surface portions 106b and 106c formed on the upper surface portions 105b and 105c of the anode 105. More specifically, in the hole injection transporting layer 106, the upper surface portions 106b and 106c are located higher than the upper surface portion 106a in the Z-axis direction.

Figure 6B:
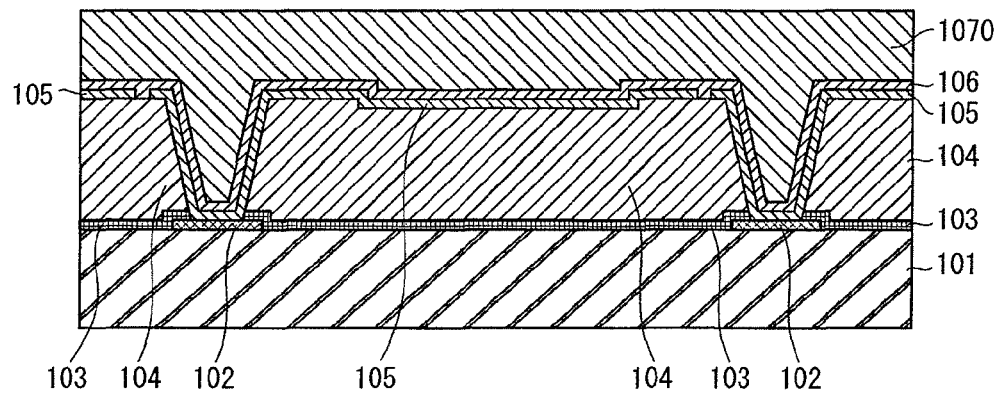

Next, as shown in FIG. 6B, a bank material layer 1070 is layered so as to cover the hole injection transporting layer 106. The bank material layer 1070 is formed by layering a photoresist material (such as acrylic resin, polyimide resin, or novolac-type phenolic resin) by the spin coating, for example.

Figure 6C:
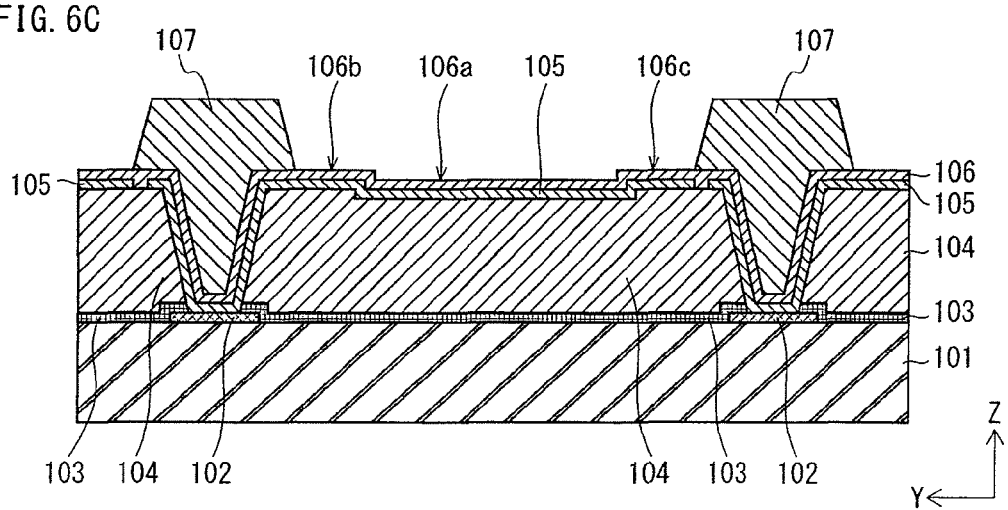

As shown in FIG. 6C, the banks 107 are formed by exposing the bank material layer 1070 to light after disposing a mask (omitted from the figures) thereon, and, after the exposure to light, developing and baking the bank material layer 1070. After formation of the banks 107, the upper surface portion (including the upper surface portions 106a, 106b and 106c) of the hole injection transporting layer 106 is exposed to an opening defined by the banks 107.

Figure 7A:
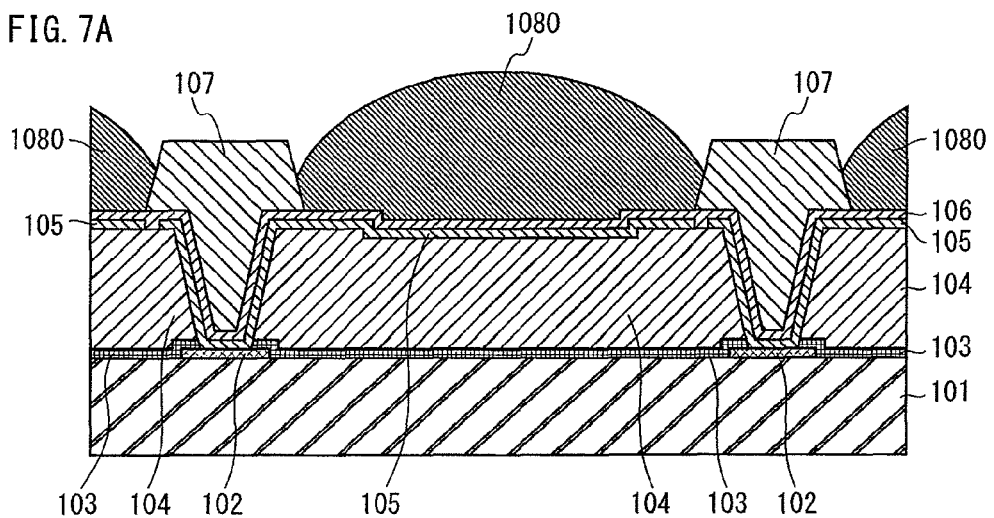
FIGS. 7A, 7B, and 7C are schematic cross-section diagrams showing, in order, the main processes in the manufacturing method of the display panel 10.
Figure 7B:
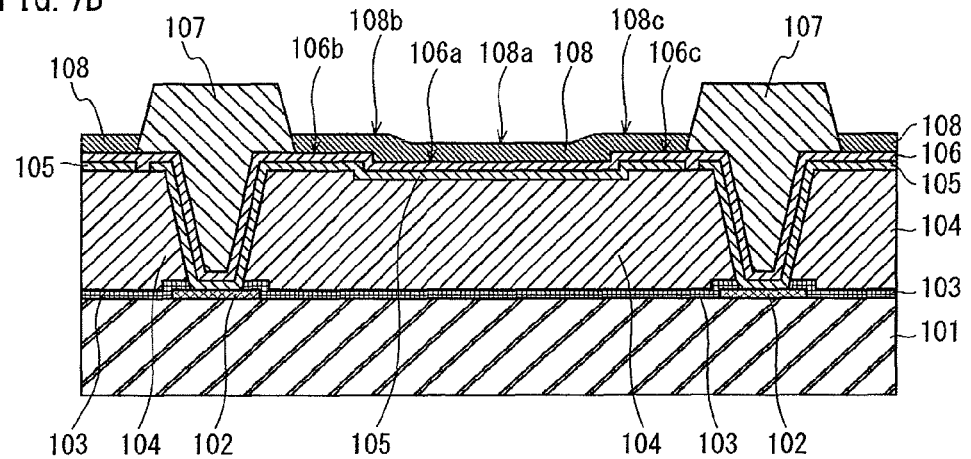

Next, as shown in FIG. 7A, ink 1080, which includes light-emitting organic material, is dripped or applied by the inkjet method or the like into the region defined by the banks 107. By drying the ink 1080, the organic light-emitting layer 108 forms, as shown in FIG. 7B.

Since the organic light-emitting layer 108 is formed to extend along the shape of the upper surface portion (including the upper surface portions 106a, 106b and 106c) of the hole injection transporting layer 106, the upper surface portions 108b and 108c in the edge regions near the banks 107 are located higher in the Z-axis direction than the upper surface portion 108a in the central region, and thus, overall, the upper surface portion of the organic light-emitting layer 108 is concave upward in the Z-axis direction. Also, the lower surface portion of the organic light-emitting layer 108 is in contact with the upper surface portion (including the upper surface portions 106a, 106b and 106c) of the hole injection transporting layer 106, and thus, overall, the lower surface portion of the organic light-emitting layer 108 is convex downward in the Z-axis direction.

Figure 7C:
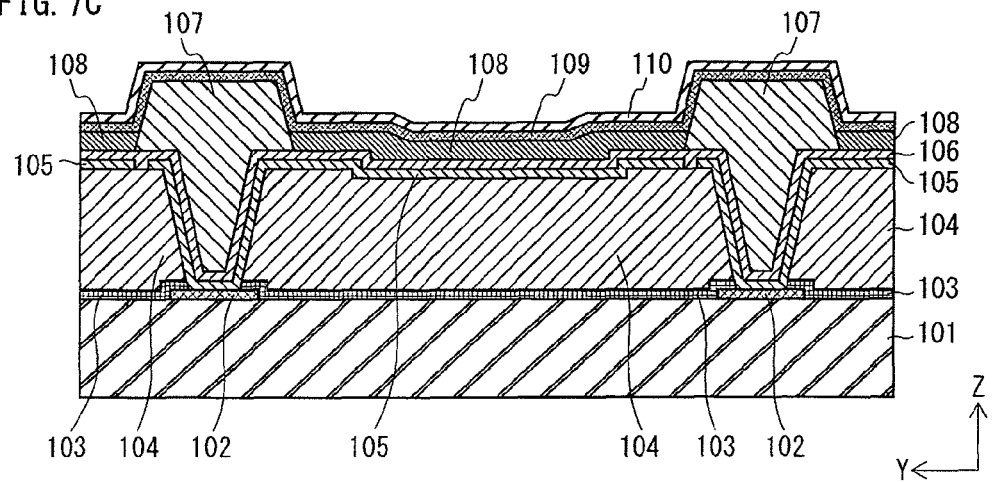

Next, as shown in FIG. 7C, the cathode 109 and the sealing layer 110 are layered in this order on the upper surface portions (including the upper surface portions 108a, 108b and 108c) of the organic light-emitting layers 108 and the surfaces of the banks 107.

As described above, an electron transport layer, an electron injection layer and the like may be inserted between the organic light-emitting layer 108 and the cathode 109.

This completes manufacturing of the main portions of the display panel 10.

Embodiment 2

Figure 8:
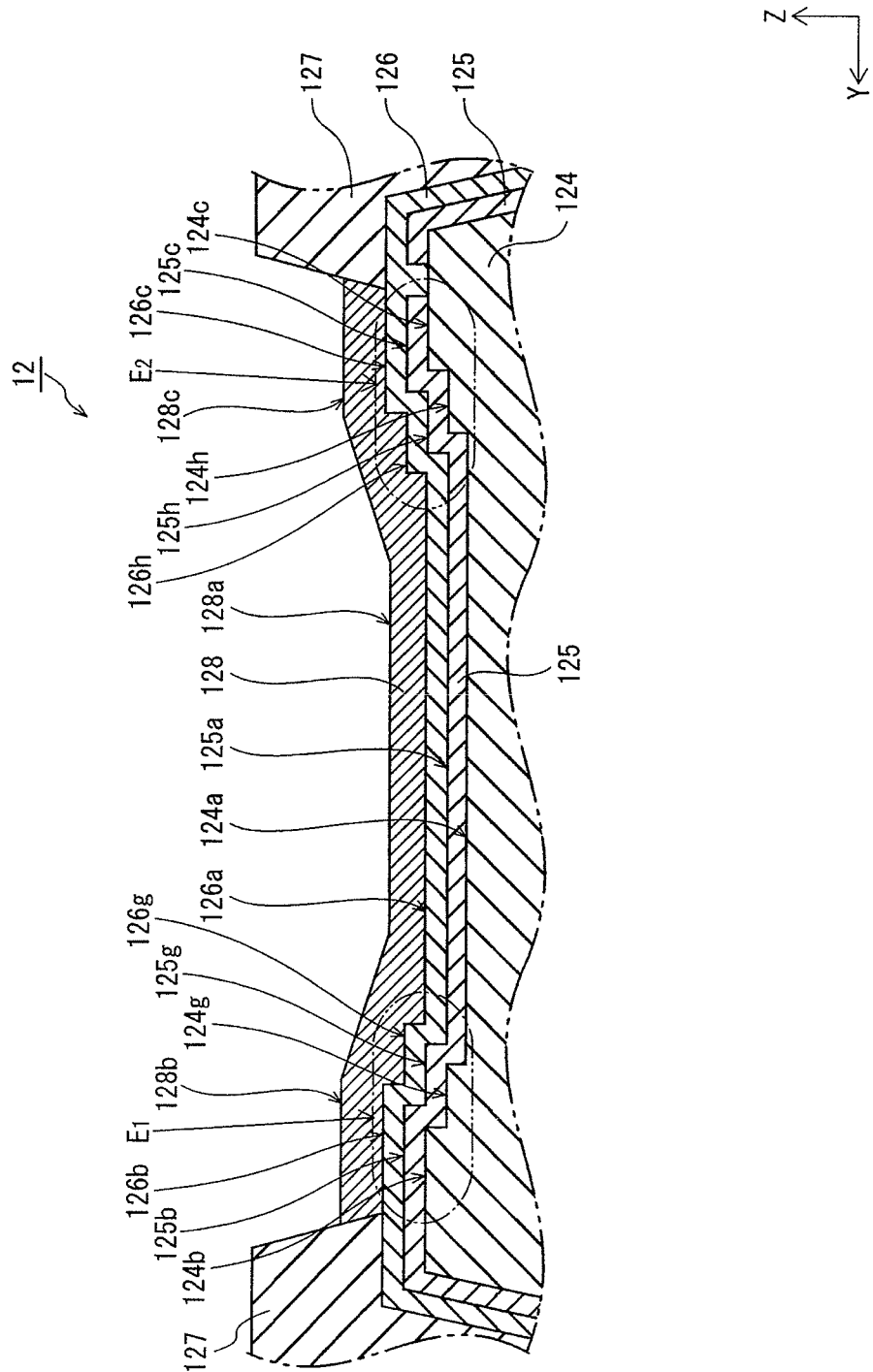
FIG. 8 is a schematic cross-section diagram showing a subpixel in a display panel 12 of an organic display device according to Embodiment 2.

The structure of the display panel 12 according to Embodiment 2 is described with reference to FIG. 8. FIG. 8 corresponds to FIG. 4 used in Embodiment 1 and focuses on the main portions of one subpixel.

As shown in FIG. 8, in the display panel 12 according to the present embodiment, an interlayer insulating layer 124 includes: upper surface portions 124b and 124c in the edge regions (regions $E_1$ and $E_2$) near banks 127; an upper surface portion 124a in the central region; and, further, upper surface portions 124g and 124h in the regions respectively between the central region and the edge regions. That is to say, in the display panel 12 according to the present embodiment, the interlayer insulating layer 124 includes: the upper surface portion 124a in the central region; the upper surface portions 124g and 124h that are located higher in the Z-axis direction than the upper surface portion 124a; and the upper surface portions 124b and 124c that are located even higher in the Z-axis direction than the upper surface portions 124g and 124h.

An anode 125, like the anode 105 in Embodiment 1, is formed to extend along the shape of the upper surface portion of the interlayer insulating layer 124 (including upper surface portions 124a, 124b and 124c), and thus includes: an upper surface portion 125a in the central region; upper surface portions 125g and 125h that are located higher in the Z-axis direction than the upper surface portion 125a; and upper surface portions 125b and 125c that are located even higher in the Z-axis direction than the upper surface portions 125g and 125h.

A hole injection transporting layer 126 is formed to extend along the upper surface portion (including the upper surface portions 125a, 125b, 125c, 125g and 125h) of the anode 125 and has an upper surface portion 126a in the central region, upper surface portions 126g and 126h located higher in the Z-axis direction, and upper surface portions 126b and 126c located even higher in the Z-axis direction.

Like the organic light-emitting layer 108 in the display panel 10 according to Embodiment 1, in an organic light-emitting layer 128, upper surface portions 128b and 128c in the edge regions near the banks 127 are located higher in the Z-axis direction than an upper surface portion 128a in the central region that is located away from the banks 127. Moreover, in the present embodiment, the lower surface portion of the organic light-emitting layer 128 is formed to extend along the upper surface portions 126a, 126b, 126c, 126g and 126h of the hole injection transporting layer 126, thus further promoting uniformity of the thickness of the organic light-emitting layer 128 in the Y-axis direction at each location.

Accordingly, the display panel 12 according to the present embodiment has even luminance and high light-emitting characteristics to a greater extent than the display panel 10 according to Embodiment 1.

Note that the structure of the display panel 12 other than the portions shown in FIG. 8 is similar to Embodiment 1.

Embodiment 3

Figure 9:
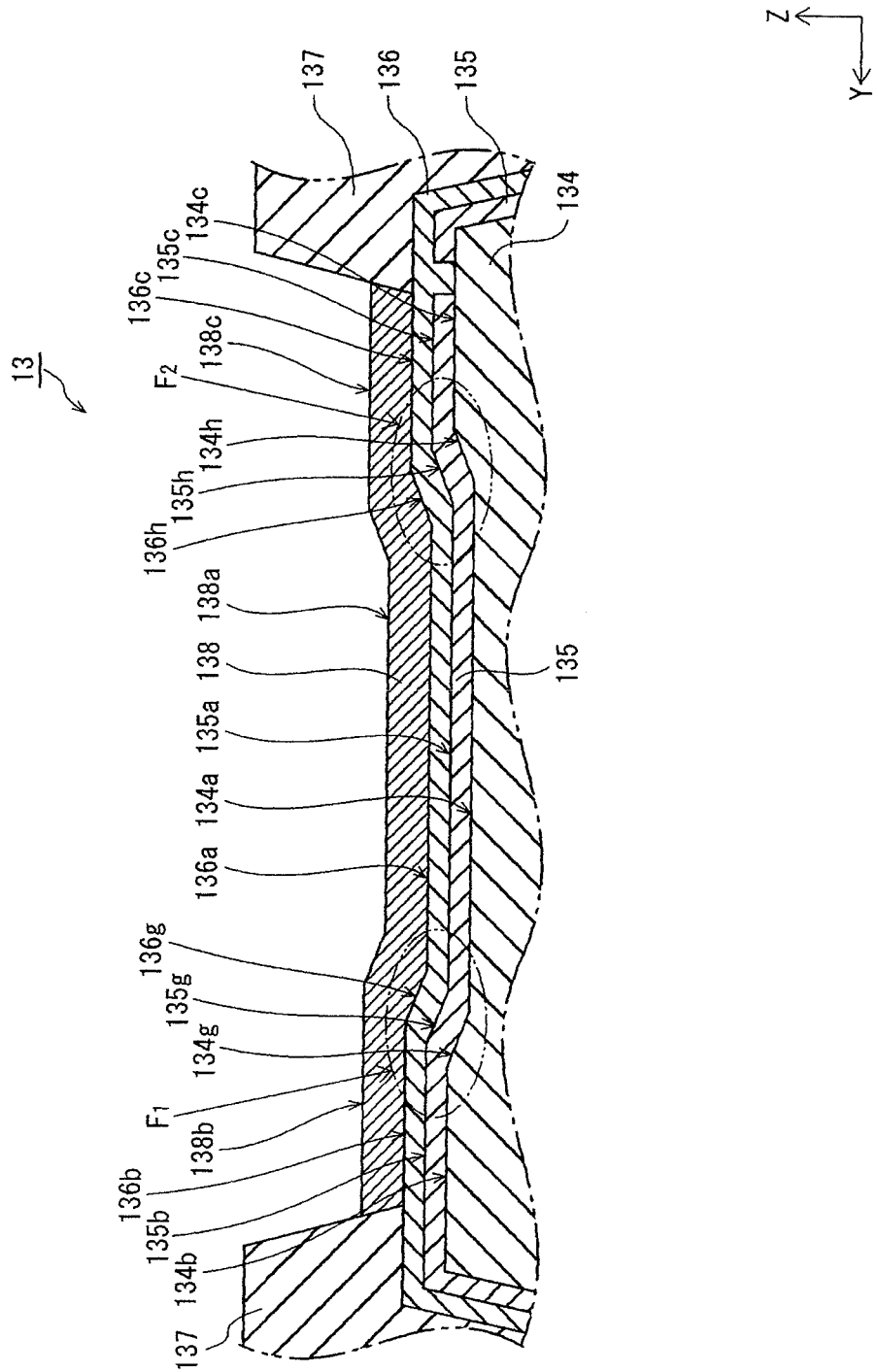
FIG. 9 is a schematic cross-section diagram showing a subpixel in a display panel 13 of an organic display device according to Embodiment 3.

The structure of a display panel 13 according to Embodiment 3 is described with reference to FIG. 9. FIG. 9 corresponds to FIG. 4 used in Embodiment 1 and focuses on the main portions of one subpixel.

As shown in FIG. 9, in the display panel 13 according to the present embodiment, an interlayer insulating layer 134 is the same as the interlayer insulating layer 104 of Embodiment 1 in that it includes: an upper surface portion 134a in the central region that is located away from banks 137; and upper surface portions 134b and 134c in the edge regions (regions $F_1$ and $F_2$) near the banks 137, and in that the upper surface portions 134b and 134c are located higher in the Z-axis direction than the upper surface portion 134a. The interlayer insulating layer 134 of the display panel 13 in the present embodiment is different from the interlayer insulating layer 104 of the display panel 10 in Embodiment 1 in that respective portions between the upper surface portion 134a and the upper surface portions 134b and 134c are not walls upright in the Z-axis direction, but are inclined surface portions 134g and 134h.

An anode 135, like the anode 105 in Embodiment 1, is formed as a layer to extend along the upper surface portion of the interlayer insulating layer 134 (including upper surface portions 134a, 134b and 134c and inclined surface portions 134g and 134h), and includes: an upper surface portion 135a in the central region; upper surface portions 135b and 135c that are located higher in the Z-axis direction than the upper surface portion 135a; and inclined surface portions 135g and 135h respectively located between the upper surface portion 135a and the upper surface portions 135b and 135c.

The hole injection transporting layer 136 is formed to extend along the upper surface portion (including the upper surface portions 135a, 135b and 135c and the inclined surface portions 135g and 135h) of the anode 135 and has an upper surface portion 136a in the central region, upper surface portions 136b and 136c located higher in the Z-axis direction, and inclined surface portions 136g and 136h located between the upper surface portion 136a and the upper surface portions 136b and 136c.

Like the organic light-emitting layer 108 of the display panel 10 according to Embodiment 1, in an organic light-emitting layer 138, upper surface portions 138b and 138c in the edge regions near the banks 137 are located higher in the Z-axis direction than an upper surface portion 138a in the central region that is located away from the banks 137. In this embodiment as well, the lower surface portion of the organic light-emitting layer 138 is formed to extend along the upper surface portions 136a, 136b and 136c and the inclined surface portions 136g and 136h, which are placed between the upper surface portion 136a and the upper surface portions 136b and 136c, of the hole injection transporting layer 136. As a result, the display device 13 according to the present embodiment further promotes uniformity of the thickness of the organic light-emitting layer 138 in the Y-axis direction at each location.

Accordingly, the display panel 13 according to the present embodiment has even luminance and high light-emitting characteristics to a greater extent than the display panel 10 according to Embodiment 1.

Note the structure of the display panel 13 other than the portions shown in FIG. 9 is similar to Embodiment 1.

Embodiment 4

Figure 10:
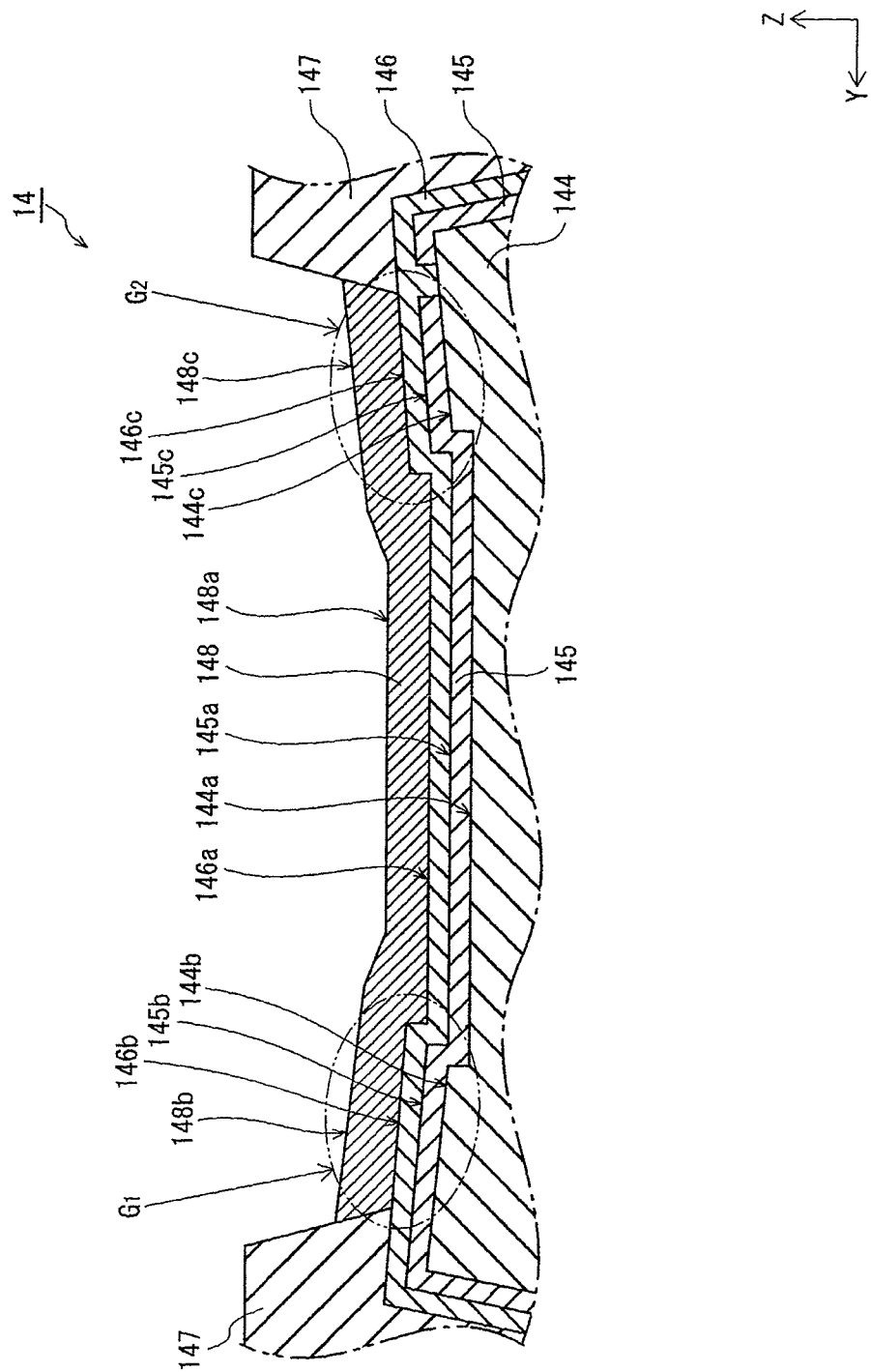
FIG. 10 is a schematic cross-section diagram showing a subpixel in a display panel 14 of an organic display device according to Embodiment 4.

The structure of a display panel 14 according to Embodiment 4 is described with reference to FIG. 10. FIG. 10 corresponds to FIG. 4 used in Embodiment 1 and focuses on the main portions of one subpixel.

As shown in FIG. 10, in the display panel 14 according to the present embodiment, an interlayer insulating layer 144 is the same as the interlayer insulating layer 104 of Embodiment 1 in that it includes: an upper surface portion 144a in the central region that is located away from banks 147; and upper surface portions 144b and 144c in the edge regions (regions $G_1$ and $G_2$) near the banks 147, and in that the upper surface portions 144b and 144c are located higher in the Z-axis direction than the upper surface portion 144a. The interlayer insulating layer 144 of the display panel 14 in the present embodiment is different from the interlayer insulating layer 104 of the display panel 10 in Embodiment 1 in that the upper surface portions 144b and 144c in the edge regions (regions $G_1$ and $G_2$) near the banks 147 are inclined surface portions, instead of the horizontal surface portions perpendicular to the Z-axis direction.

An anode 145, like the anode 105 in Embodiment 1, is formed as a layer to extend along the upper surface portion of the interlayer insulating layer 144 (including upper surface portions 144a, 144b and 144c), and includes: an upper surface portion 145a in the central region; and upper surface portions 145b and 145c that are located higher in the Z-axis direction than the upper surface portion 145a.

The hole injection transporting layer 146 is formed to extend along the upper surface portion (including the upper surface portions 145a, 145b and 145c) of the anode 145 and has an upper surface portion 146a in the central region, and upper surface portions 146b and 146c located higher in the Z-axis direction.

Like the organic light-emitting layer 108 of the display panel 10 according to Embodiment 1, in an organic light-emitting layer 148, upper surface portions 148b and 148c in the edge regions near the banks 147 are located higher in the Z-axis direction than an upper surface portion 148a in the central region that is located away from the banks 147. In this embodiment as well, the lower surface portion of the organic light-emitting layer 148 is formed to extend along the upper surface portions 146a, 146b and 146c of the hole injection transporting layer 146. As a result, the display device 14 according to the present embodiment further promotes uniformity of the thickness of the organic light-emitting layer 148 in the Y-axis direction at each location.

Accordingly, the display panel 14 according to the present embodiment has even luminance and high light-emitting characteristics to a greater extent than the display panel 10 according to Embodiment 1.

Note the structure of the display panel 14 other than the portions shown in FIG. 10 is similar to Embodiment 1.

Furthermore, the surface profile of the organic light-emitting layer 148 in the display panel 14 according to the present embodiment differs from the surface profile of the organic light-emitting layers 108, 128 and 138 in Embodiments 1, 2 and 3 respectively, but the surface profile does not change due to a level difference in the underlayer. In other words, when the surface profile of the organic light-emitting layer 148 is as shown in FIG. 10, the present embodiment may be adopted.

Other Considerations

In Embodiment 1, the hole injection transporting layer 106, which is below the organic light-emitting layer 108 in the Z-axis direction, is formed to extend along the shape of the upper surface portion of the anode 105, so that the upper surface portions 106b and 106c in the edge regions near the banks 107 are located higher in the Z-axis direction than the upper surface portion 106a in the central region located away from the banks 107. Furthermore, in Embodiment 2, the upper surface portion 126a, the upper surface portions 126g and 126h, and the upper surface portions 126b and 126c form steps.

By forming the lower surface portion of the organic light-emitting layers 108, 128, 138 and 148 along the profile of the upper surface portions insofar as possible, it has been described that the difference between the thickness in the edge regions near the banks 107, 127, 137 and 147 and the thickness in the central regions located away from the banks 107, 127, 137 and 147 can be reduced. From the perspective of accuracy during manufacturing and of manufacturing costs, it is preferable for the upper surface profile of the functional layer, such as the hole injection transporting layer provided directly below the organic light-emitting layer, to be approximated as closely as possible to the upper surface profile of the organic light-emitting layer. For example, the number of steps in the upper surface profile of the functional layer can be set to three or greater, and inclined surface portions may be provided between steps.

Note that the structures in Embodiments 1, 2, 3 and 4 may be combined while taking into consideration the upper surface profile of the organic light-emitting layers 108, 128, 138 and 148.

Furthermore, in Embodiments 1, 2, 3 and 4, the respective hole injection transporting layer 106, 126, 136 and 146 is inserted between the respective anode 105, 125, 135 and 145 and the respective organic light-emitting layer 108, 128, 138 and 148. The present invention is not, however, limited in this way. For example, a structure where only the hole-injection layer is inserted may be adopted.

In Embodiments 1, 2, 3 and 4, an example of a structure is described in which the respective anode 105, 125, 135 and 145 is provided below the respective organic light-emitting layer 108, 128, 138 and 148 in the Z-axis direction, and the cathode 109 is provided thereabove in the Z-axis direction. Conversely, the cathode may be provided lower in the Z-axis direction, with the anode being provided higher in the Z-axis direction.

In Embodiments 1, 2, 3 and 4, it is assumed that light emitted by the organic light-emitting layers 108, 128, 138 and 148 traverses the cathode 109 and is emitted upward in the Z-axis direction (top-emission type). Conversely, the present invention may be adopted in a structure in which light traverses the substrate 101 and is emitted downward in the Z-axis direction (bottom-emission type).

Figure 11:
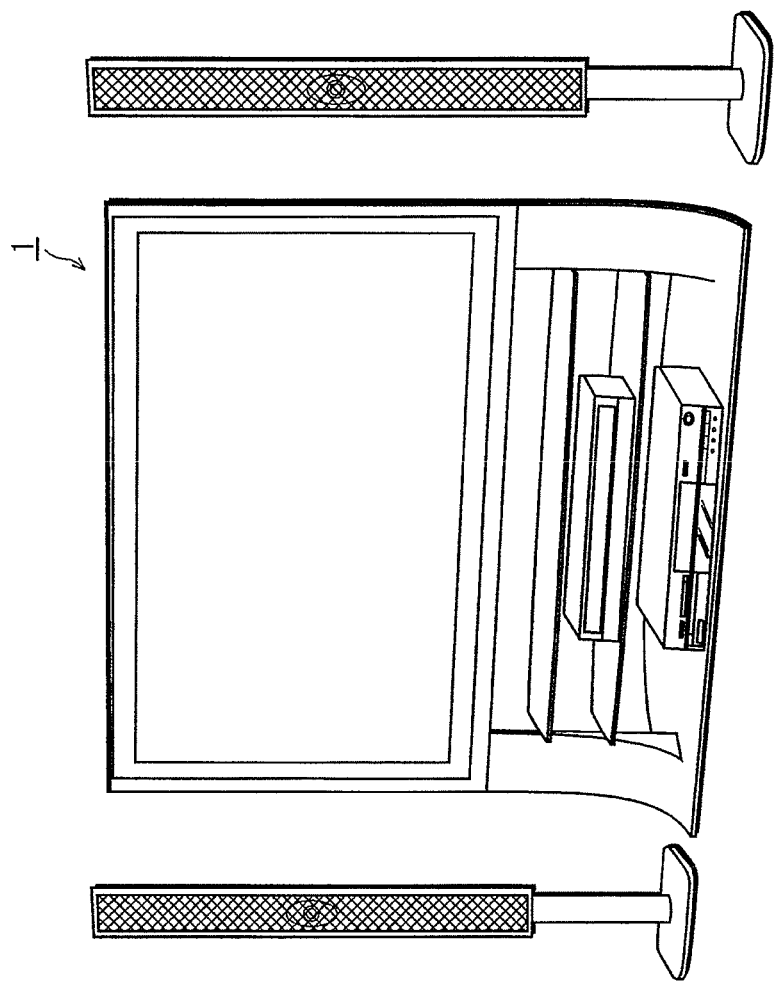
FIG. 11 is an external perspective view showing an example of the appearance of a set that includes the organic display device 1.

In Embodiments 1, 2, 3 and 4, a specific example of the appearance of the organic display device 1 is not shown. The organic display device 1 may be part or all of a system as shown, for example, in FIG. 11.

INDUSTRIAL APPLICABILITY

The present invention is useful for achieving an organic light-emitting element, organic display panel, and organic display device with even luminance and high light-emitting characteristics.

REFERENCE SIGNS LIST 1 organic display device
10, 12, 13, 14 display panel
20 drive control unit
21-24 drive circuit
25 control circuit
100a, 100b, 100c subpixel
101 substrate
102 TFT layer
103 passivation layer
104, 124, 134, 144 interlayer insulating layer
105, 125, 135, 145 anode
106, 126, 136, 146 hole injection transporting layer
107, 127, 137, 147 bank
108, 128, 138, 148 organic light-emitting layer
109 cathode
110 sealing layer
501 mask
1040 insulating film
1070 bank material layer
1080 ink

The invention claimed is:

1. An organic light-emitting element, comprising:
an underlayer including a substrate, a drive circuit formed on the substrate, and an interlayer insulating layer formed on the drive circuit;
a first electrode formed above the underlayer;
a functional layer formed above the first electrode;
a plurality of banks which, formed above the first electrode, define an opening for a light-emitting cell, thereby separating the light-emitting cell from light-emitting cells adjacent thereto;
a light-emitting layer formed, from ink containing an organic light-emitting material, in the opening above the functional layer; and
a second electrode which, formed above the light-emitting layer, has opposite polarity from the first electrode, wherein
the underlayer includes a first upper surface portion and a second upper surface portion, the first upper surface portion corresponding to a region of the light-emitting layer near a bank among the plurality of banks, the second upper surface portion corresponding to another region located away from banks and below a center of the light-emitting layer located between banks,
the first upper surface portion is located higher than the second upper surface portion,
the first electrode extends along the first upper surface portion and the second upper surface portion of the underlayer, and includes a first upper surface portion and a second upper surface portion, the first upper surface portion corresponding to the edge region, the second upper surface portion corresponding to the another region,
the first upper surface portion of the first electrode is located higher than the second upper surface portion of the first electrode,
the functional layer extends along the first upper surface portion and the second upper surface portion of the first electrode, and includes a first upper surface portion and a second upper surface portion, the first upper surface portion corresponding to the edge region, the second upper surface portion corresponding to the another region,
the first upper surface portion of the functional layer is located higher than the second upper surface portion of the functional layer,
the light-emitting layer extends along the first upper surface portion and the second upper surface portion of the functional layer, and includes a first lower surface portion, a second lower surface portion, a first upper surface portion, and a second upper surface portion, the first lower surface portion being in contact with the functional layer and corresponding to the edge region, the second lower surface portion being in contact with the functional layer and corresponding to the another region, the first upper surface portion being provided on an opposite side from the functional layer and corresponding to the edge region, the second upper surface portion being provided on an opposite side from the functional layer and corresponding to the another region,
the first lower surface portion of the light-emitting layer is located higher than the second lower surface portion of the light-emitting layer,
the first upper surface portion of the light-emitting layer is located higher than the second upper surface portion of the light-emitting layer,
a thickness of the light-emitting layer between the first lower surface portion and the first upper surface portion is equal to a thickness of the light-emitting layer between the second lower surface portion and the second upper surface portion,
the interlayer insulating layer in the underlayer includes a first upper surface portion and a second upper surface portion, the first upper surface portion corresponding to the edge region, the second upper surface portion corresponding to the another region, the first upper surface portion of the interlayer insulating layer is located higher than the second upper surface portion of the interlayer insulating layer, and the second upper surface portion of the interlayer insulating layer is flat, and the first upper surface portion of the interlayer insulating layer has a level difference with respect to the second upper surface portion of the interlayer insulating layer, or is formed as a step.

2. The organic light-emitting element of claim 1, wherein an upper surface portion of the light-emitting layer, including the first upper surface portion and the second upper surface portion, is concave upward due to the first upper surface portion of the light-emitting layer being located higher than the second upper surface portion of the light-emitting layer, and a lower surface portion of the light-emitting layer, including the first lower surface portion and the second lower surface portion, is convex downward due to the first lower surface portion of the light-emitting layer being located higher than the second lower surface portion of the light-emitting layer.

3. The organic light-emitting element of claim 1, wherein the first upper surface portion of the functional layer is located higher than the second upper surface portion of the functional layer by at least 100 nm and at most 200 nm.

4. The organic light-emitting element of claim 1, wherein when viewing a cross-section of the light-emitting layer between the banks, a length of the first upper surface portion of the light-emitting layer is at least 50 μm, a length of the second upper surface portion of the light-emitting layer is at least 50 μm, the length of the first upper surface portion of the light-emitting layer is at least ⅕ and at most ⅓ an entire length of each light-emitting cell, and the length of the second upper surface portion of the light-emitting layer is at least ⅓ and at most ⅗ the entire length of each light-emitting cell.

5. The organic light-emitting element of claim 1, wherein in the light-emitting layer, the another region is centered between adjacent banks.

6. The organic light-emitting element of claim 1, wherein the light-emitting cells are arrayed in two different directions, the plurality of banks are formed in the two different directions so as to separate adjacent light-emitting cells one from another, and the first upper surface portion and the second upper surface portion of the underlayer, the first upper surface portion and the second upper surface portion of the first electrode, the first upper surface portion and the second upper surface portion of the functional layer, and the first upper surface portion, the second upper surface portion, the first lower surface portion, and the second lower surface portion of the light-emitting layer extend along a long axis direction of the light-emitting layer when viewing each light-emitting cell from above.

7. The organic light-emitting element of claim 1, wherein in plan view, outer edges of the second upper portion of the underlayer follow lower end sides of banks that define a light-emitting cell.

8. The organic light-emitting element of claim 1, wherein the second upper portion of the underlayer exists on a one-for-one basis for each light-emitting cell.

9. A method of manufacturing an organic light-emitting element, comprising:

a first step of forming a drive circuit on a substrate and forming an interlayer insulating layer on the drive circuit in order to form an underlayer that includes the substrate, the drive circuit and the interlayer insulating layer;

a second step of forming a first electrode above the underlayer;

a third step of forming a functional layer above the first electrode;

a fourth step of forming a plurality of banks above the first electrode to define an opening a plurality of banks which, formed above the first electrode, define an opening for a light-emitting cell, thereby separating the light-emitting cell from light-emitting cells adjacent thereto;

a fifth step of forming a light-emitting layer in the opening above the functional layer by applying ink that includes an organic light-emitting material; and a sixth step of forming a second electrode, having opposite polarity from the first electrode, above the light-emitting layer, wherein in the first step, the underlayer is formed so that the underlayer includes a first upper surface portion and a second upper surface portion, the first upper surface portion corresponding to a region of the light-emitting layer near a bank among the plurality of banks, the second upper surface portion corresponding to another region located away from the bank toward banks and below a center of the light-emitting layer located between banks, and the first upper surface portion is located higher than the second upper surface portion, in the second step, the first electrode is formed to extend along the first upper surface portion and the second upper surface portion of the underlayer so that the first electrode includes a first upper surface portion and a second upper surface portion, the first upper surface portion corresponding to the edge region, the second upper surface portion corresponding to the another region, and the first upper surface portion of the first electrode is located higher than the second upper surface portion of the first electrode, in the third step, the functional layer is formed to extend along the first upper surface portion and the second upper surface portion of the first electrode so that the functional layer includes a first upper surface portion and a second upper surface portion, the first upper surface portion corresponding to the edge region, the second upper surface portion corresponding to the another region, and the first upper surface portion of the functional layer is located higher than the second upper surface portion of the functional layer, in the fifth step, the light-emitting layer is formed to extend along the first upper surface portion and the second upper surface portion of the functional layer so that the light-emitting layer includes a first lower surface portion, a second lower surface portion, a first upper surface portion, and a second upper surface portion, the first lower surface portion being in contact with the functional layer and corresponding to the edge region, the second lower surface portion being in contact with the functional layer and corresponding to the another region, the first upper surface portion being provided on an opposite side from the functional layer and corresponding to the edge region, the second upper surface portion being provided on an opposite side from the functional layer and corresponding to the another region, the first lower surface portion of the light-emitting layer is located higher than the second lower surface portion of the light-emitting layer, the first upper surface portion of the light-emitting layer is located higher than the second upper surface portion of the light-emitting layer, a thickness of the light-emitting layer between the first lower surface portion and the first upper surface portion is equal to a thickness of the light-emitting layer between the second lower surface portion and the second upper surface portion, and in the first step, the interlayer insulating layer is formed so that the interlayer insulating layer includes a first upper surface portion and a second upper surface portion, the first upper surface portion corresponding to the edge region, the second upper surface portion corresponding to the another region, the first upper surface portion of the interlayer insulating layer is located higher than the second upper surface portion of the interlayer insulating layer, and the second upper surface portion of the interlayer insulating layer is flat, and the first upper surface portion of the interlayer insulating layer has a level difference with respect to the second upper surface portion of the interlayer insulating layer, or is formed as a step.

10. The organic light-emitting element manufacturing method of claim 9, wherein in the first step, the interlayer insulating layer is formed by forming an insulating film from a photosensitive, insulating resin material, causing the insulating film to be exposed selectively, and then developing the selectively exposed insulating film.

11. The organic light-emitting element manufacturing method of claim 10, wherein in the first step, the interlayer insulating layer is formed by causing a portion of the insulating film corresponding to the first upper layer of the interlayer insulating layer to be exposed to an amount of light that is smaller than an amount of light to which another portion of the insulating film corresponding to the second upper layer of the interlayer insulating layer is exposed, and then developing the exposed insulating film.

12. An organic display panel using an organic light-emitting element manufactured by the organic light-emitting element manufacturing method of claim 9.

13. An organic display device using an organic light-emitting element manufactured by the organic light-emitting element manufacturing method of claim 9.

14. The organic light-emitting element manufacturing method of claim 9, wherein in plan view, outer edges of the second upper portion of the underlayer follow lower end sides of banks that define a light-emitting cell.

15. The organic light-emitting element manufacturing method of claim 9, wherein the second upper portion of the underlayer exists on a one-for-one basis for each light-emitting cell.

* * * * *